US009960092B2

(12) United States Patent
Ikemoto et al.

(10) Patent No.: US 9,960,092 B2
(45) Date of Patent: May 1, 2018

(54) INTERLAYER FILLER COMPOSITION FOR THREE-DIMENSIONAL INTEGRATED CIRCUIT

(71) Applicant: MITSUBISHI CHEMICAL CORPORATION, Chiyoda-ku (JP)

(72) Inventors: Makoto Ikemoto, Kitakyushu (JP); Yasuhiro Kawase, Kitakyushu (JP); Tomohide Murase, Yokohama (JP); Makoto Takahashi, Yokkaichi (JP); Takayoshi Hirai, Yokkaichi (JP); Iho Kamimura, Yokkaichi (JP)

(73) Assignee: Mitsubishi Chemical Corporation, Chiyoda-ku (JP)

( * ) Notice: Subject to any disclaimer, the term of this patent is extended or adjusted under 35 U.S.C. 154(b) by 26 days.

(21) Appl. No.: 13/865,318

(22) Filed: Apr. 18, 2013

(65) Prior Publication Data

US 2014/0030848 A1   Jan. 30, 2014

Related U.S. Application Data

(63) Continuation of application No. PCT/JP2011/073969, filed on Oct. 18, 2011.

(30) Foreign Application Priority Data

Sep. 12, 2010   (JP) ................................. 2010-274544
Oct. 18, 2010   (JP) ................................. 2010-233799
(Continued)

(51) Int. Cl.
*H01L 23/18*   (2006.01)
*H01L 23/00*   (2006.01)
(Continued)

(52) U.S. Cl.
CPC .............. *H01L 23/18* (2013.01); *C08L 63/00* (2013.01); *C09D 163/00* (2013.01); *H01L 24/13* (2013.01);
(Continued)

(58) Field of Classification Search
CPC ......... H01L 23/18; H01L 24/13; H01L 24/83; C08L 63/00; C09D 163/00
See application file for complete search history.

(56) References Cited

U.S. PATENT DOCUMENTS

| | | | |
|---|---|---|---|
| 6,617,046 B2 * | 9/2003 | Noro et al. .................... | 428/620 |
| 2002/0089067 A1 * | 7/2002 | Crane .................... | H01L 21/563 257/778 |

(Continued)

FOREIGN PATENT DOCUMENTS

| EP | 2 071 000 A1 | 6/2009 |
|---|---|---|
| JP | 11-172025 | 6/1999 |

(Continued)

OTHER PUBLICATIONS

U.S. Appl. No. 14/041,341, filed Sep. 30, 2013, Kawase, et al.
(Continued)

*Primary Examiner* — Alonzo Chambliss
(74) *Attorney, Agent, or Firm* — Oblon, McClelland, Maier & Neustadt, L.L.P.

(57) ABSTRACT

To provide an interlayer filler composition which, in 3D lamination of semiconductor device chips, forms a highly thermally conductive filling interlayer simultaneously with the bonding of solder bumps or the like and lands between semiconductor device chips, a coating fluid and a process for producing a three-dimensional integrated circuit.

An interlayer filler composition for a three-dimensional integrated circuit, which comprises a resin (A) having a melt viscosity at 120° C. of at most 100 Pa·s and a flux (B), the
(Continued)

content of the flux (B) being at least 0.1 part by weight and at most 10 parts by weight per 100 parts by weight of the resin (A).

34 Claims, 3 Drawing Sheets

(30) Foreign Application Priority Data

Dec. 1, 2010 (JP) .................................. 2010-268412
Dec. 1, 2010 (JP) .................................. 2010-268413

(51) Int. Cl.
*C09D 163/00* (2006.01)
*C08L 63/00* (2006.01)

(52) U.S. Cl.
CPC .... *H01L 24/83* (2013.01); *H01L 2924/10253* (2013.01); *H01L 2924/12042* (2013.01); *H01L 2924/14* (2013.01); *H01L 2924/15747* (2013.01)

(56) References Cited

U.S. PATENT DOCUMENTS

| | | | | |
|---|---|---|---|---|
| 2006/0103028 | A1* | 5/2006 | Hazeyama et al. | 257/778 |
| 2007/0116962 | A1* | 5/2007 | Asano et al. | 428/413 |
| 2007/0134844 | A1* | 6/2007 | Katoh et al. | 438/108 |
| 2007/0232498 | A1* | 10/2007 | Uchida et al. | 505/150 |
| 2010/0059872 | A1* | 3/2010 | Katsurayama | 257/686 |

FOREIGN PATENT DOCUMENTS

| | | |
|---|---|---|
| JP | 2001-311005 | 11/2001 |
| JP | 2006-2095 | 1/2006 |
| JP | 2007-9188 | 1/2007 |
| JP | 2007-116079 A | 5/2007 |
| JP | 2008-510878 A | 4/2008 |
| JP | 2010-1427 | 1/2010 |
| JP | 2010-1427 A | 1/2010 |
| WO | WO 2006/023860 A2 | 3/2006 |
| WO | 2010-079831 | 7/2010 |

OTHER PUBLICATIONS

U.S. Appl. No. 13/865,318, filed Apr. 18, 2013, Ikemoto, et al.
Combined Chinese Office Action and Search Report dated Oct. 11, 2014, in Patent Application No. 201180049911.8 (with English-language translation).
Combined Taiwanese Office Action and Search Report dated May 20, 2015 in Patent Application No. 100137643 (with English language translation).
Office Action in corresponding Japanese application No. 2011-228311, dated Feb. 26, 2015. (w/English Translation).
Office Action in corresponding Japanese application No. 2011-228103, dated Jul. 16, 2014. (w/English Translation).
Extended Search Report dated Jun. 7, 2017 in European Patent Application No. 11834363.1.
Office Action dated Aug. 28, 2017, in corresponding Korean patent Application No. 10-2013-7009533 (with English-language Translation).
"Inter Chip Fill for 3D Chip Stack", Proceedings of the Japan Institute of Electronics Packaging Annual Meeting, 23, 2009, pp. 61-62.
The Latest Technology of Epoxy Resin for Electronic Devices (CMC publishing Co., Ltd., Chapter 1, pp. 24-31, Chapter 5, 2006, pp. 114-121.
Science and Application of Soldering (Kogyo Chosakai Publishing Co., Ltd.), Jun. 25, 2000, 8 pages.
International Search Report dated Jan. 24, 2012 in PCT/JP2011/073969 filed Oct. 18, 2011.
English translation of Chinese Office Action dated Jun. 30, 2015 in connection with corresponding Chinese Patent Application No. 201180049911.8, filed Oct. 18, 2011.

* cited by examiner

INTERLAYER FILLER COMPOSITION FOR THREE-DIMENSIONAL INTEGRATED CIRCUIT

TECHNICAL FIELD

The present invention relates to an interlayer filler composition for a three-dimensional integrated circuit, a coating fluid containing the interlayer filler composition, and a process for producing a three-dimensional integrated circuit containing the interlayer filler composition.

BACKGROUND ART

In recent years, for further improvement in the performance of semiconductor devices such as speeding up and an increase in the capacity, research and development is in progress to improve the performance by a three-dimensional integrated circuit having at least two layers of semiconductor device chips laminated to constitute a three-dimensional (3D) lamination, in addition to refinement of transistors and wiring.

A three-dimensional integrated circuit has a structure such that semiconductor device chips are connected e.g. by electric signal terminals such as solder bumps and are bonded by a filling interlayer formed by being filled with an interlayer filler composition.

Specifically, such a process is proposed (Non-Patent Document 1) that a thin film of an interlayer filler composition is formed on a wafer by coating, B-stage formation is carried out, and then chips are cut out by dicing, temporary bonding by pressure heating is repeatedly carried out by using the chips, and finally main bonding (solder bonding) is carried out under pressure heating conditions.

For practical use of such a three-dimensional integrated circuit device, various problems have been pointed out, and one of them is a problem of dissipation of heat generated from a device such as a transistor or wiring. This problem results from a commonly very low coefficient of thermal conductivity of an interlayer filler composition to be used for lamination of semiconductor device chips as compared with metals and ceramics, and there are concerns about a decrease in the performance due to accumulation of heat in laminated device chips.

As one means to solve the problem, an increase in the coefficient of thermal conductivity of the interlayer filler composition may be mentioned. For example, a highly thermally conductive epoxy resin is used as a resin itself constituting the interlayer filler composition, or such a resin is combined with a highly thermally conductive inorganic filler, to make the interlayer filler composition be highly thermally conductive. For example, Patent Document 1 discloses an interlayer filler composition having spherical boron nitride aggregates blended as a filler. Boron nitride is usually in the form of plate particles, and has different coefficient of thermal conductivity as between in the long axis direction and in the minor axis direction, however, by binding the boron nitride particles with a binder to form spherical aggregates, the coefficient of thermal conductivity becomes uniform in the respective directions, whereby the coefficient of thermal conductivity will be improved by blending the boron nitride aggregates as a filler in the resin.

Further, as a patent relating to the improvement in the thermal conductivity of an epoxy resin itself, a method of introducing a mesogen skeleton into an epoxy resin has been disclosed. For example, Non-Patent Document 2 discloses improvement in the thermal conductivity of an epoxy resin by introducing various mesogen skeletons. However, although improvement in the thermal conductivity is confirmed, such an invention cannot be said to be practical considering the balance of the cost, the process compatibility, the hydrolysis resistance and the thermal stability.

Further, Patent Document 2 discloses an epoxy resin having good thermal conductivity using only a biphenyl skeleton, but only very low molecular weight epoxy resins have been synthesized, which lack film forming properties, and such resins are hardly useful as a thin film.

Further, with respect to an epoxy resin composition containing an inorganic filler, a resin may be peeled on the inorganic filler surface, and a desired coefficient of thermal conductivity is not achieved in some cases. Further, an epoxy resin having a mesogen skeleton with a not high epoxy equivalent has high crystallinity and has a hard structure in many cases after being cured, and the balance between the thermal conductivity and reduction in the stress has been desired.

On the other hand, in a conventional process of mounting semiconductor device chip on an interposer or the like, first, electric signal terminals such as solder bumps on the semiconductor device chip side are subjected to activation treatment by a flux, and then bonded to a substrate having lands (electric connection electrode), and the space between the substrates is filled with a liquid resin or an underfill material having an inorganic filler added to a liquid resin, which is cured, whereby the bonding is completed. On that occasion, the flux is required to have properties to remove the surface oxide film on the metal electric signal terminals such as solder bumps and the lands, and to improve wettability, and further, an activation treatment function such as prevention of reoxidation on the metal terminal surface.

As the flux, commonly, in addition to an inorganic metal salt containing halogen excellent in capability in solving the metal oxide film of the electric signal terminals, an organic acid or an organic acid salt, an organic halogen compound or an amine, rosin or its constituent, is used alone or in combination of two or more of them (for example, Non-Patent Document 3).

Further, in the 3D lamination process of semiconductor device chips, if activation treatment of the electric signal terminals such as solder bumps using a flux is carried out first, a flux layer having low thermal conductivity is formed on the surface of the terminals, and there are concerns about inhibition of thermal conductivity between the laminated substrates by the interlayer filler composition, or deterioration by corrosion of connection terminals by remaining flux components. Accordingly, a flux which can be directly mixed with an interlayer filler composition having high thermal conductivity and which is less likely to corrode metal terminals has been desired.

As mentioned above, a highly thermally conductive interlayer filler composition has been required to have not only compatibility to the 3D lamination process and capability in being formed into a thin film, but also connection properties to electric signal terminals between semiconductor device chips, and further technical development has been required.

PRIOR ART DOCUMENTS

Patent Documents

Patent Document 1: JP-A-2008-510878
Patent Document 2: JP-A-2010-001427

Non-Patent Documents

Non-Patent Document 1: Proceedings of The Japan Institute of Electronics Packaging, Annual Meeting, 61, 23, 2009

Non-Patent Document 2: The Latest Technology of Epoxy Resin for Electronic Devices (CMC Publishing Co., Ltd., 2006, Chapter 1, p 24 to 31, Chapter 5, p 114 to 121)

Non-Patent Document 3: Science and Application of Soldering (Kogyo Chosakai Publishing Co., Ltd.)

DISCLOSURE OF INVENTION

Technical Problem

One of problems to be solved for practical use of a three-dimensional integrated circuit, is a problem of dissipation of heat generated from a device such as a transistor or wiring. This problem results from a commonly very low coefficient of thermal conductivity of an interlayer filler composition to be used for lamination of semiconductor device chips as compared with metals and ceramics, and there are concerns about a decrease in the performance due to accumulation of heat in laminated device chips, and an interlayer filler composition having a higher coefficient of thermal conductivity has been required.

Further, in the above three-dimensional integrated circuit, for further improvement in the performance such as speeding up and an increase in the capacity, the distance between the respective chips is so small as a level of from 10 to 50 μm.

In the filling interlayer between the chips, in order to further increase the coefficient of thermal conductivity, the maximum volume particle size of the filler to be blended as the case requires is required to be at most about ⅓ of the thickness of the filling interlayer, and in order to increase the coefficient of thermal conductivity, it is preferred to blend a larger amount of the filler. Particularly when a fine filler is used, it is necessary to blend a large amount of the filler. However, if the amount of the filler blended is too large, the bonding power of the interlayer filler composition may be decreased, or the flexibility at the time of melting may be decreased in some cases.

The spherical boron nitride aggregates as disclosed in Patent Document 1 have a high coefficient of thermal conductivity but has a too large particle size and thus they cannot be used as a filler for the interlayer filler composition.

Accordingly, it is necessary to use a finner filler, however, if a filler having a small particle size is used, it can hardly be uniformly mixed when blended with a resin constituting the interlayer filler composition. In addition, the number of thermally conductive paths required is increased, whereby the probability of the thermally conductive paths being connected from top to bottom in the thickness direction between the chips tends to be low, and the coefficient of thermal conductivity in the thickness direction of the filling interlayer may be insufficient.

Further, with respect to the interlayer filler composition for a three-dimensional integrated circuit, after formation of a B-stage film in an intermediate stage of the reaction of the thermosetting resin in which the material is softened and expanded by heating but is not completely melted or dissolved even when contacted with a liquid, the material is softened by heating an its melt viscosity is significantly reduced, and utilizing such a phenomenon, pressure bonding of e.g. solder bumps is carried out by pressurizing the substrates in the 3D lamination process. Accordingly, as the curing profile of the interlayer filler composition, it is important that the composition is not completely cured at a temperature for the B-stage formation or bonding the solder bumps, has fluidity in a short time and then gelated, and then completely cured. Accordingly, the resin constituting the interlayer filler composition is required that its melt viscosity is controlled by the heating temperature, in conformity with the bonding power to bond the chips and with the process for producing the three-dimensional integrated circuit.

Further, a three-dimensional integrated circuit is required that semiconductor device chips are electrically connected by e.g. electric signal terminals such as solder bumps and are bonded by a filling interlayer formed by being filled with an interlayer filler composition. However, the electric signal terminals can hardly be securely connected electrically in the interlayer filler composition in some cases.

In the present invention, by incorporating a flux in the interlayer filler composition for a three-dimensional integrated circuit, it is attempted that electric signal terminals are securely connected electrically in the interlayer filler composition. However, even in such a case, some of flux components have a low solubility in a monomer, an oligomer and a polymer as the epoxy resin components and an organic solvent, and are hardly uniformly dissolved by mixing with the interlayer filler composition.

Further, the acidic or basic functional group which the flux has a function as a curing agent in addition to the function as a flux to the solder, and it may cause curing of the epoxy resin at a temperature before the B-stage formation or solder bump bonding, whereby bonding of the solder bumps or the like to lands may be inhibited.

Under these circumstances, the object of the present invention is to provide an interlayer filler composition having an excellent bonding property between solder bumps or the like and lands between semiconductor device chips and capable of forming a highly thermally conductive filling interlayer, in the 3D lamination process of semiconductor device chips, a coating fluid containing the interlayer filler composition, and a process for producing a three-dimensional integrated circuit containing the interlayer filler composition.

Solution to Problem

The present inventors have conducted extensive studies and as a result, found that the above problems can be solved by the following invention, and accomplished the present invention.

That is, the present invention provides the following.

1. An interlayer filler composition for a three-dimensional integrated circuit, which comprises a resin (A) having a melt viscosity at 120° C. of at most 100 Pa·s and a flux (B), the content of the flux (B) being at least 0.1 part by weight and at most 10 parts by weight per 100 parts by weight of the resin (A).

2. The interlayer filler composition for a three-dimensional integrated circuit according to the above 1, which further contains a curing agent (C).

3. The interlayer filler composition for a three-dimensional integrated circuit according to the above 1 or 2, which further contains an inorganic filler (D) having a coefficient of thermal conductivity of at least 1 W/mK in an amount of at least 50 parts by weight and at most 400 parts by weight per 100 parts by weight of the resin (A).

4. An interlayer filler composition for a three-dimensional integrated circuit, which comprises a resin (A) having a melt viscosity at 120° C. of at most 100 Pa·s and a coefficient of thermal conductivity of at least 0.2 W/mK, an inorganic filler (D) having a coefficient of thermal conductivity of at least 2 W/mK, a volume average particle size of at least 0.1

μm and at most 5 μm and a maximum volume particle size of at most 10 μm, and a curing agent (C) and/or a flux (B).

5. The interlayer filler composition for a three-dimensional integrated circuit according to any one of the above 1 to 4, wherein the melt viscosity of the resin (A) at 50° C. is at least 2,000 Pa·s.

6. The interlayer filler composition for a three-dimensional integrated circuit according to any one of the above 1 to 5, wherein the resin (A) is a thermosetting resin.

7. The interlayer filler composition for a three-dimensional integrated circuit according to any one of the above 1 to 6, wherein the resin (A) is an epoxy resin.

8. The interlayer filler composition for a three-dimensional integrated circuit according to the above 7, wherein the epoxy resin is an epoxy resin (A1) which is a phenoxy resin, or a mixture of the epoxy resin (A1) and an epoxy resin (A2) which is an epoxy resin having at least two epoxy groups in its molecule.

9. The interlayer filler composition for a three-dimensional integrated circuit according to the above 7, wherein the epoxy resin is an epoxy resin (B) represented by the following formula (1) having an epoxy equivalent of at least 2,500 g/equivalent and at most 30,000 g/equivalent:

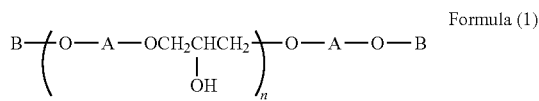

Formula (1)

wherein A is a biphenyl skeleton represented by the following formula (2), B is a hydrogen atom or a group represented by the following formula (3), and n is a number of repetition and its average is 1<n<100;

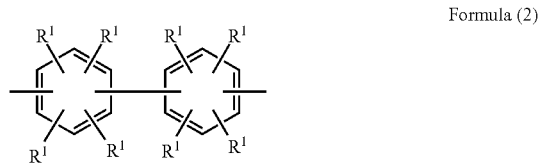

Formula (2)

wherein each of $R^1$'s which are the same or different, is a hydrogen atom, a $C_{1-10}$ hydrocarbon group or a halogen atom;

Formula (3)

10. The interlayer filler composition for a three-dimensional integrated circuit according to the above 9, wherein $R^1$ in the above formula (2) is a hydrogen atom or a $C_{1-4}$ alkyl group, and the biphenyl skeleton represented by the formula (2) has at least one hydrogen atom and at least one $C_{1-4}$ alkyl group.

11. The interlayer filler composition for a three-dimensional integrated circuit according to the above 9 or 10, which further contains an epoxy resin (C) having an epoxy equivalent of less than 2,500 g/equivalent.

12. The interlayer filler composition for a three-dimensional integrated circuit according to the above 11, wherein the proportion of the epoxy resin (C) based on all the epoxy resins including the epoxy resin (B) and the epoxy resin (C) is at least 10 wt % and at most 80 wt %.

13. The interlayer filler composition for a three-dimensional integrated circuit according to any one of the above 1 to 12, wherein the flux (B) is an organic carboxylic acid.

14. The interlayer filler composition for a three-dimensional integrated circuit according to the above 13, wherein the decomposition temperature of the organic carboxylic acid is at least 130° C.

15. The interlayer filler composition for a three-dimensional integrated circuit according to any one of the above 3 to 14, wherein the amount of the inorganic filler (D) is at least 5 vol % and at most 60 vol % based on the total volume of the resin (A) and the inorganic filler (D).

16. The interlayer filler composition for a three-dimensional integrated circuit according to any one of the above 3 to 15, wherein the inorganic filer (D) is a boron nitride filler.

17. The interlayer filler composition for a three-dimensional integrated circuit according to any one of the above 2 to 16, wherein the curding agent (C) is imidazole or its derivative.

18. A coating fluid of an interlayer filler composition for a three-dimensional integrated circuit, which comprises the interlayer filler composition as defined in any one of the above 1 to 17 and further contains an organic solvent (E).

19. A process for producing a three-dimensional integrated circuit, which comprises a step of forming a film of the interlay filler composition as defined in any one of the above 1 to 18 on surfaces of a plurality of semiconductor substrates, and laminating such semiconductor substrates by pressure bonding.

Advantageous Effects of Invention

According to the present invention, an interlayer filler composition which forms a highly thermally conductive filling interlayer simultaneously with bonding of solder bumps or the like and lands between semiconductor device substrates, a coating fluid containing the interlayer filler composition, and a process for producing a three-dimensional integrated circuit containing the interlayer filler composition, can be provided.

According to the interlayer filler composition for a three-dimensional integrated circuit of the present invention, in the 3D lamination process of semiconductor device chips, bonding is carried out by a fine inorganic filler particularly having a high coefficient of thermal conductivity and an epoxy resin having a high coefficient of thermal conductivity, and having an excellent bonding property between the solder bumps or the like and the lands between the semiconductor chips, whereby the heat dissipation properties are high, and in a case where the inorganic filler is used, a further highly thermally conductive filling interlayer can be formed.

BRIEF DESCRIPTION OF DRAWINGS

FIG. 1(a) is a plan view and FIG. 1(b) is a cross-sectional view.

DESCRIPTION OF EMBODIMENTS

Figure 1A:
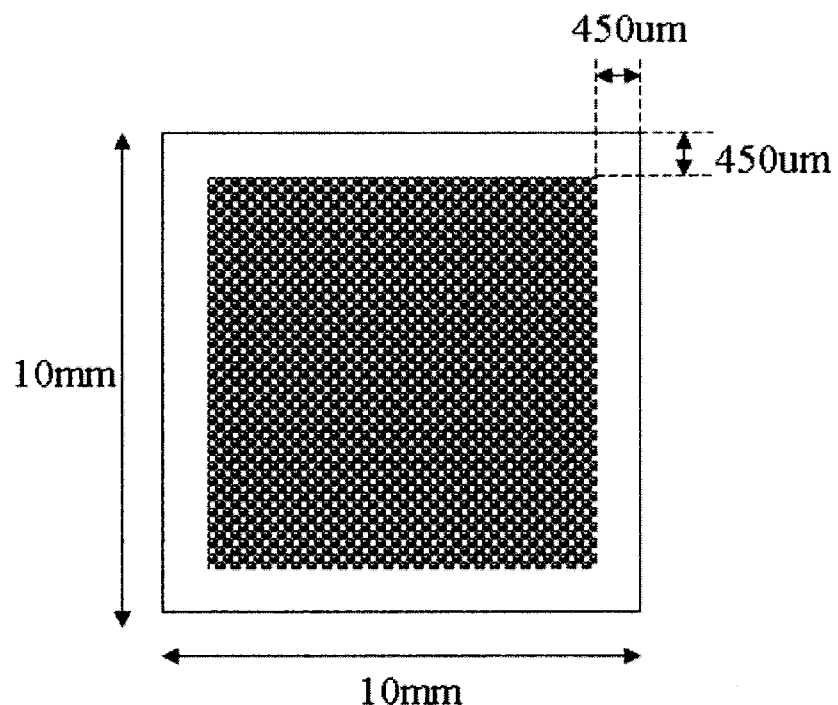
FIG. 1(a) and FIG. 1(b) are drawings schematically illustrating a solder bump substrate used for evaluation of bonding.
Figure 1B:
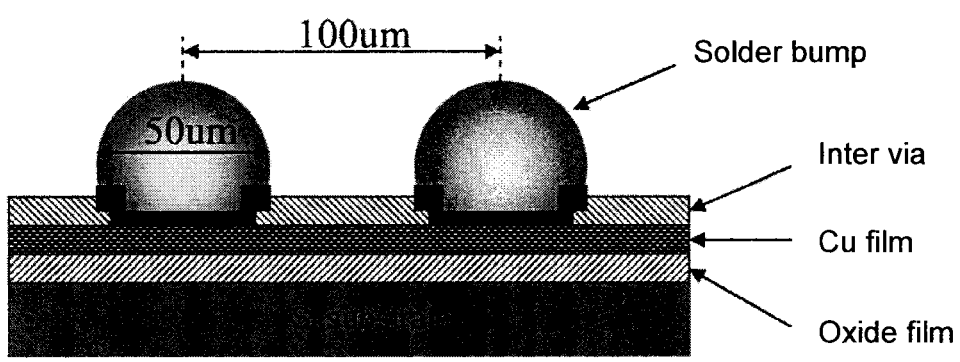

Now, embodiments of the present invention will be described. However, the present invention is not limited to the following embodiments, and various modifications are possible within a range of the scope of the invention.

In this specification, the expression "from . . . to . . . " is meant to include the indicated values.

[Interlayer Filler Composition for Three-Dimensional Integrated Circuit]

The interlayer filler composition for a three-dimensional integrated circuit of the present invention (in the present invention, sometimes referred to simply as an interlayer filler composition) is a composition which bonds semiconductor substrates constituting the respective layers of a three-dimensional integrated circuit and which can form a filler layer with which the space between the semiconductor substrates is filled.

With respect to the interlayer filler composition for a three-dimensional integrated circuit, by the melt viscosity of the resin (A) at 120° C. being at most 100 Pas, the resin can be melted and thereby have a remarkably reduced viscosity before solder bumps are melted, bonding of the solder bumps and land terminals by heat pressing is possible, and further, by pressure bonding a film of the interlayer filler composition formed on the semiconductor substrates at 200° C. or higher, the solder bumps can be melted, whereby they are electrically connected with the land terminals. On that occasion, by addition of a predetermined curing agent, the interlayer filler composition will not be cured at the temperature for the B-stage formation or the bonding of the solder bumps, but it has fluidity in a short time after bonding of the solder bumps and then gelated and then completely cured, whereby a stable interlayer filler film can be formed.

Further, when the melt viscosity of the resin (A) at 50° C. is at least 2,000 Pa·s, the tack property at room temperature after the B-stage film formation can be reduced, and by positioning of the substrates at the time of lamination, temporary bonding of the substrates to be laminated for the three-dimensional integrated circuit becomes possible.

Now, the respective components will be described below.

[Resin (A)]

Of the resin (A) in the present invention. The melt viscosity at 120° C. is essentially at most 100 Pa·s, preferably at most 20 Pa·s, in order that when main boding is carried out after the temporary bonding, the interlayer filler composition is melted by heating to connect electric connection terminals. Further, of the resin (A), the melt viscosity at 50° C. is preferably at least 2,000 Pa·s, more preferably at least 10,000 Pa·s, in order that after a thin film of the interlayer filler composition is formed on a substrate, positioning with a substrate to be bonded is carried out before the temporary bonding.

Further, of the resin (A), the coefficient of thermal conductivity is preferably at least 0.2 W/mK, more preferably at least 0.22 W/mK, in order to obtain sufficient thermal conductivity when combined with the after-mentioned inorganic filler (D).

As the resin (A), a resin which meets the above melt viscosity conditions can be used, and a thermosetting resin is preferred. Preferred examples of the thermosetting resin include an acrylic resin, an epoxy resin, thermosetting polyimide resin and a thermosetting phenol resin. Among them, an epoxy resin or a thermosetting polyimide resin is preferred.

Particularly, the resin (A) in the present invention is preferably an epoxy resin. As the epoxy resin, an epoxy resin having a single type of structural units may be used alone, however, so long as the above melt viscosity conditions are met, a plurality of epoxy resins differing in the structural units may be used in combination.

The epoxy resin preferably contains at least the after-mentioned phenoxy resin (hereinafter referred to as epoxy resin (A1)), in order to reduce voids at the time of bonding to obtain a highly thermally conductive cured product, in addition to have coating properties or film formation properties and bonding properties, and particularly, it preferably contains the epoxy resin (A1) in a weight ratio based on the total amount of the epoxy resins of preferably from 5 to 95 wt %, more preferably from 10 to 90 wt %, further preferably from 20 to 80 wt %.

[Epoxy Resin (A1) and Epoxy Resin (A2)]

A phenoxy resin usually means a resin obtainable by reacting an epihalohydrin with a dihydric phenol compound, or a resin obtainable by reacting a bivalent epoxy compound with a dihydric phenol compound. In the present invention, among such resins, particularly a phenoxy resin which is a high molecular weight epoxy resin having a weight average molecular weight of at least 10,000 will be referred to as an epoxy resin (A1).

The epoxy resin (A1) is preferably a phenoxy resin having at least one skeleton selected from the group consisting of a naphthalene skeleton, a fluorene skeleton, a biphenyl skeleton, an anthracene skeleton, a pyrene skeleton, a xanthene skeleton, an adamantane skeleton and a dicyclopentadiene skeleton. Among them, a phenoxy resin having a fluorene skeleton and/or a biphenyl skeleton is particularly preferred, whereby the heat resistance is more increased.

As described above, as the epoxy resin (A), a plurality of epoxy resins differing in the structural units may be used.

The epoxy resin other than the above epoxy resin (A1) is preferably an epoxy resin having at least two epoxy groups in its molecule (hereinafter referred to as epoxy resin (A2)). The epoxy resin (A2) may, for example, be a bisphenol A type epoxy resin, a bisphenol F type epoxy resin, a naphthalene type epoxy resin, a phenol novolak type epoxy resin, a cresol novolak type epoxy resin, a phenol aralkyl type epoxy resin, a biphenyl type epoxy resin, a triphenylmethane type epoxy resin, a dicyclopentadiene type epoxy resin, a glycidyl ester type epoxy resin, a glycidyl amine type epoxy resin or a polyfunctional phenol type epoxy resin. They may be used alone or as a mixture of two or more.

The epoxy resin (A2) has, with a view to controlling the melt viscosity, an average molecular weight of preferably from 100 to 5,000, more preferably from 200 to 2,000. One having an average molecular weight lower than 100 tends to be inferior in the heat resistance, and with one having an average molecular weight higher than 5,000, the melting point of the epoxy resin tends to be high, thus lowering the workability.

Further, in the present invention, as the epoxy resin, within a range not to impair the objects, an epoxy resin other than the epoxy resin (A1) and the epoxy resin (A2) (hereinafter referred to as other epoxy resin) may be used. The content of such other epoxy resin is usually at most 50 wt %, preferably at most 30 wt % based on the total amount of the epoxy resin (A1) and the epoxy resin (A2).

In a case where the epoxy resin (A2) is used in the present invention, the proportion of the epoxy resin (A1) in all the epoxy resins including the epoxy resin (A1) and the epoxy resin (A2) is from 10 to 90 wt %, preferably from 20 to 80 wt %, based on the total amount of 100 wt %. Here, "all the epoxy resins including the epoxy resin (A1) and the epoxy resin (A2)" means the epoxy resin (A1) and the epoxy resin (A2) in total when the epoxy resins contained in the epoxy resin composition of the present invention are only the epoxy resin (A1) and the epoxy resin (A2), and means the epoxy resin (A1), the epoxy resin (A2) and other epoxy resin in total when other epoxy resin is further contained.

By the proportion of the epoxy resin (A1) being at least 10 wt %, a sufficient effect of improving the thermal conductivity by blending the epoxy resin (A1) can be obtained, and desired high thermal conductivity can be obtained. By the proportion of the epoxy resin (A1) being less than 90 wt % and the proportion of the epoxy resin (A2) being at least 10 wt %, the effect of blending the epoxy resin (A2) can be obtained, and sufficient curing properties and physical properties of a cured product will be obtained.

[Epoxy Resin (B)]

in the present invention, the epoxy resin is particularly preferably an epoxy resin (B) having a structure represented by the following formula (1) and having an epoxy equivalent of at least 2,500 g/equivalent:

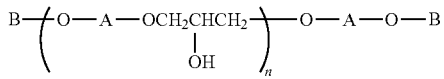

Formula (1)

wherein A is a biphenyl skeleton represented by the following formula (2), B is a hydrogen atom or a group represented by the following formula (3), and n is a number of repetition and its average is $10<n<50$;

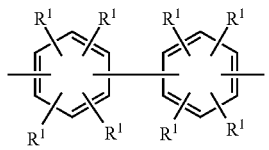

Formula (2)

wherein each of $R^1$'s which are the same or different, is a hydrogen atom, a $C_{1-10}$ hydrocarbon group or a halogen atom;

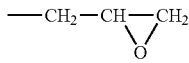

Formula (3)

The epoxy resin (B) is an epoxy resin having sufficient extensibility and excellent in the balance between the thermal conductivity and the heat resistance.

Almost all the conventional highly thermally conductive epoxy resins are epoxy resins designed to increase the thermal conductivity, there are restrictions on the curing process and the like including the curing conditions in many cases, and the degree of freedom of their selection is low. Accordingly, in a case where a conventional highly thermally conductive epoxy resin is to be applied to members or products such as sealing agents and adhesives, it has been difficult to satisfy both of required properties of products including the cost and high thermal conductivity.

Whereas, the epoxy resin (B) is excellent in the thermal conductivity by itself, can increase the thermal conductivity of a cured product by addition of a desired amount as an epoxy resin component, and can impart a low stress property to a material, resulting from the extensibility of the epoxy resin (B).

The reason why the epoxy resin (B) is excellent in the extensibility is not clearly understood in detail, but is estimated as follows. It has a molecular chain length which can endure orientation when a tensile stress is applied, and further, to relax the stress, the overlapping biphenyl skeletons can "slip". Further, on that occasion, if the crystallinity is too high, the resin tends to be fragile and will be broken without extending, and thus it is important that it appropriately has an amorphous moiety. It is considered that the crystallinity of the epoxy resin (B) can be moderately lowered by the biphenyl skeleton having a substituent, and this leads to the extensibility. Accordingly, from the viewpoint of the extensibility, it is preferred that not all $R^1$'s in the formula (2) are hydrogen atoms, and at least one $R^1$ is a hydrocarbon group or a halogen atom.

Thermal conductivity is controlled by phonons and conduction electrons, and in the case of having free electrons like a metal, contribution by the conduction electrons is remarkable, but an epoxy resin is commonly an insulating material, and in the case of an insulating material, phonons are principal factors for the thermal conductivity. Thermal conductivity by phonons is propagation of the oscillation energy, and a material of which the oscillation is less likely to attenuate and which is harder, is more excellent in the thermal conductivity.

The reason why the epoxy resin (B) is excellent in the thermal conductivity is not clearly understood in detail, but is estimated as follows. As all the skeletons are biphenyl skeletons, the degree of freedom of the structure is low, and the oscillation energy is less likely to attenuate, and as the biphenyl skeleton is highly planner, the molecules are well overlapping, and the molecular motion can be more restrained.

Usually, an epoxy resin having higher crystallinity tends to be more excellent in the heat resistance, and in the case of epoxy resins having the same structure, an epoxy resin having a higher molecular weight or a higher epoxy equivalent tends to be more excellent in the heat resistance. The epoxy resin (B) having appropriate crystallinity and a high epoxy equivalent, is also excellent in the heat resistance.

In the formula (1) representing the epoxy resin (B), n is the number of repetition, and is the average value. The range of the value is $10<n<50$, and in view of the balance of both the extensibility and the handling efficiency of the resin, the range of n is preferably $15<n<50$, more preferably $20<n<50$. If n is at most 10, extensibility of the epoxy resin (B) tends to be insufficient, and if it is at least 50, the viscosity of the composition containing the epoxy resin (B) tends to be high, and such a composition tends to be difficult to handle.

Further, in the above formula (1), A is a biphenyl skeleton represented by the formula (2), and in the formula (2), $R^1$'s which may be the same or differed, is a hydrogen atom, a $C_{1-10}$ hydrocarbon group or a halogen atom, and preferred is one wherein both hydrogen atom and $C_{1-10}$ hydrocarbon group are contained as $R^1$'s in one molecule of the epoxy resin, from the viewpoint of the crystallinity and the handling of the epoxy resin (B). When $R^1$'s are the same, the crystallinity tends to be high, and the thermal conductivity can be increased, however, if the crystallinity is too high, the extension when such an epoxy resin composition is formed into a film tends to be small.

In a case where $R^1$ in the formula (2) is a $C_{1-10}$ hydrocarbon group, $R^1$ is preferably a $C_{1-4}$ alkyl group, particularly preferably a methyl group.

The hydrocarbon group as $R^1$ may have a substituent, and the substituent is not particularly limited but is one having a molecular weight of at most 200.

Further, the halogen atom as $R^1$ means a fluorine atom, a chlorine atom or a bromine atom, and only one or a plurality of them may be contained.

The biphenyl skeleton as A is any one of a 2,2'-biphenyl skeleton, a 2,3'-biphenyl skeleton, a 2,4'-biphenyl skeleton, a 3,3-biphenyl skeleton, a 3,4'-biphenyl skeleton and a 4,4'-biphenyl skeleton and is preferably a 4,4'-biphenyl skeleton. Further, $R^1$ preferably a hydrogen atom at the 2- and/or 6-position, and is preferably a hydrocarbon group at the 3- and/or 5-position.

In a case where the epoxy resin (B) is used, its epoxy equivalent is preferably at least 2,500 g/equivalent. If the epoxy equivalent of the epoxy resin (B) is less than 2,500 g/equivalent, no sufficient extensibility will be obtained, and such a composition may be difficult to handle when applied to a process such as film formation or coating.

From the viewpoint of the extensibility, the epoxy equivalent of the epoxy resin (B) is preferably at least 3,000 g/equivalent, more preferably at least 4,000 g/equivalent.

On the other hand, the upper limit of the epoxy equivalent is not particularly limited, but in view of the handling efficiency and workability, it is preferably at most 30,000 g/equivalent, more preferably at most 15,000 g/equivalent, further preferably at most 10,000 g/equivalent. The epoxy equivalent of the epoxy resin (B) is obtained by a method disclosed in the after-mentioned Examples.

The weight average molecular weight Mw of the epoxy resin (B) is preferably at least 10,000 and at most 200,000. One having a weight average molecular weight lower than 10,000 tends to be inferior in the extensibility, and if the weight average molecular weight is higher than 200,000, such a resin tends to be difficult to handle. The weight average molecular weight of the epoxy resin (B) is obtained by a method disclosed in the after-mentioned Examples.

The coefficient of thermal conductivity (coefficient of thermal conductivity before curing) of the epoxy resin (B) is usually at least 0.18 W/mK, preferably at least 0.19 W/mK, more preferably at least 0.20 W/mK. Usually, the coefficient of thermal conductivity of an epoxy resin is evaluated as a cured product of an epoxy resin, and a common uncured bisphenol A type epoxy resin usually has a coefficient of thermal conductivity lower than the above value, and as it is liquid, preparation of a sample for measurement of the extensibility is impossible in many cases.

The epoxy resin (B) of the present invention has sufficient film formation properties and coefficient of thermal conductivity even in a state of a resin itself before curing, and is also excellent in the balance with the extensibility. The coefficient of thermal conductivity of the epoxy resin (A) is measured by a method disclosed in the after-mentioned Examples.

The epoxy resin (B) is excellent in the heat resistance, and when evaluated by the glass transition temperature Tg disclosed in the after-mentioned Examples, Tg of at least 90° C. and at most 220° C. can be achieved. Tg of the epoxy resin is preferably higher in the case of the purpose of use of the present invention, and is preferably at least 95° C., more preferably at least 100° C., further preferably at least 105° C. However, if Tg is too high, the curing reaction will not sufficiently proceed at a heating temperature employed in the forming process, and problems may arise such that the quality will not be stable, or required physical properties will not develop, and accordingly the upper limit is usually preferably 200° C.

Now, the process for producing the epoxy resin (B) will be described.

The epoxy resin (B) may be obtained, for example, by a two-stage process of reacting a bifunctional epoxy resin (X) having a biphenyl skeleton with a biphenol compound (Y). Otherwise, it may also be obtained by a one-stage process of directly reacting one or more biphenol compounds (Y) with epichlorohydrin. However, as the biphenol compound (Y) is not well soluble in a solvent, a solvent commonly employed for the one-stage process may not be applicable as it is in some cases, and accordingly it is preferred to employ the two-stage process.

The bifunctional epoxy resin (X) to be used for production of the epoxy resin (B) is a compound having a biphenyl skeleton and having two epoxy groups in its molecule, and may, for example, be an epoxy resin obtainable by condensing a biphenol compound represented by the following formula (4) with an epihalohydrin:

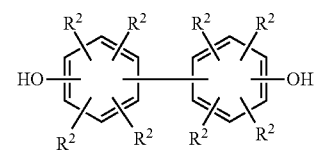

Formula (4)

wherein $R^2$ is the same as $R^1$ in the formula (2).

The biphenol compound represented by the formula (4) may, for example, be 2,2'-biphenol, 2,3'-biphenol, 2,4'-biphenol, 3,3'-biphenol, 3,4'-biphenol, 4,4'-biphenol, 2-methyl-4,4'-biphenol, 3-methyl-4,4'-biphenol, 2,2'-dimethyl-4,4'-biphenol, 3,3'-dimethyl-4,4'-biphenol, 3,3',5,5'-tetramethyl-4,4'-biphenol, 2,2',3,3',5,5'-hexamethyl-4,4'-biphenol, or 2,2',3,3',5,5',6,6'-octamethyl-4,4'-biphenol. Among them, preferred is 4,4'-biphenol, 3,3'-dimethyl-4,4'-biphenol or 3,3',5,5'-tetramethyl-4,4'-biphenol. In a case where a condensation reaction with an epihalohydrin is carried out, such biphenol compounds may be used alone or used in combination of two or more of them. Further, a plurality of bifunctional epoxy resins (X) obtained by condensing such a biphenol compound with an epihalohydrin may be used in combination.

As the bifunctional epoxy resin (X), it is preferred to use as the material a bifunctional epoxy resin (X) having a concentration of hydrolyzable chlorine which is its terminal group impurity of at most 200 ppm, and has an a glycol group concentration of at most 100 meq/kg. If the hydrolyzable chlorine concentration is higher than 200 ppm, or the a glycol group concentration is higher than 100 meq/kg, no sufficiently high molecular weight will be obtained, such being unfavorable.

On the other hand, the biphenol compound (Y) is a compound having two hydroxy groups bonded to a biphenyl skeleton, and is represented by the above formula (4). The biphenol compound (Y) may, in the same manner as above, for example, be 2,2'-biphenol, 2,3'-biphenol, 2,4'-biphenol, 3,3'-biphenol, 3,4'-biphenol, 4,4'-biphenol, 2-methyl-4,4'-biphenol, 3-methyl-4,4'-biphenol, 2,2'-dimethyl-4,4'-biphenol, 3,3'-dimethyl-4,4'-biphenol, 3,3',5,5'-tetramethyl-4,4'- biphenol, 2,2',3,3',5,5'-hexamethyl-4,4'-biphenol, or 2,2',3, 3',5,5',6,6'-octamethyl-4,4'-biphenol. Among them, preferred is 4,4'-biphenol, 3,3'-dimethyl-4,4'-biphenol or 3,3',5,5'-tetramethyl-4,4'-biphenol. A plurality of such biphenol compounds may be used in combination.

Further, it is preferred that the biphenyl skeletons contained in the bifunctional epoxy resin (X) and the biphenol compound (Y) are not simultaneously non-substituted, and it is preferred that the biphenyl skeleton has at least one substituent in one molecule. If all the biphenyl skeletons are non-substituted, the obtainable epoxy resin (B) tends to have high crystallinity and be inferior in the extensibility.

In production of the epoxy resin (B), the amount of use of the bifunctional epoxy resin (X) and the biphenol compound (Y) is preferably such that epoxy groups:phenolic hydroxy groups=1:0.90 to 1.10 by the equivalent ratio. When the equivalent ratio is within the above range, the epoxy resin (B) will have a sufficiently high molecular weight.

For preparation of the epoxy resin (B), a catalyst may be used, and the catalyst is not limited so long as it is a compound having a catalytic activity to accelerate a reaction of an epoxy group with a phenolic hydroxy group, an alcoholic hydroxy group or a carboxy group. It may, for example, be an alkali metal compound, an organic phosphorus compound, a tertiary amine, a quaternary ammonium salt, a cyclic amine or an imidazole. Such catalysts may be used alone or in combination of two or more.

The alkali metal compound may, for example, be specifically an alkali metal hydroxide such as sodium hydroxide, lithium hydroxide or potassium hydroxide, an alkali metal salt such as sodium carbonate, sodium bicarbonate, sodium chloride, lithium chloride or potassium chloride, an alkali metal alkoxide such as sodium methoxide or sodium ethoxide, an alkali metal phenoxide, a hydride of an alkali metal such as sodium hydride or lithium hydride, or an alkali metal salt of an organic acid such as sodium acetate or sodium stearate.

The organic phosphorus compound may, for example, be specifically tri-n-propylphosphine, tri-n-butylphosphine, triphenylphosphine, tetramethylphosphonium bromide, tetramethylphosphonium iodide, tetramethylphosphonium hydroxide, trimethylcyclohexyl phosphonium chloride, trimethylcyclohexyl phosphonium bromide, trimethylbenzyl phosphonium chloride, trimethylbenzyl phosphonium bromide, tetraphenylphosphonium bromide, triphenylmethyl phosphonium bromide, triphenylmethyl phosphonium iodide, triphenylethyl phosphonium chloride, triphenylethyl phosphonium bromide, triphenylethyl phosphonium iodide, triphenylbenzyl phosphonium chloride or triphenylbenzyl phosphonium bromide.

The tertiary amine may, for example, be specifically triethylamine, tri-n-propylamine, tri-n-butylamine, triethanolamine or benzyldimethylamine.

The quaternary ammonium salt may, for example, be specifically tetramethylammonium chloride, tetramethylammonium bromide, tetramethylammonium hydroxide, triethylmethylammonium chloride, tetraethylammonium chloride, tetraethylammonium bromide, tetraethylammonium iodide, tetrapropylammonium bromide, tetrapropylammonium hydroxide, tetrabutylammonium chloride, tetrabutylammonium bromide, tetrabutylammonium iodide, benzyltrimethylammonium chloride, benzyltrimethylammonium bromide, benzyltrimethylammonium hydroxide, benzyltributylammonium chloride or phenyltrimethylammonium chloride.

The cyclic amine may, for example, be specifically 1,8-diazabicyclo(5,4,0)undecene-7,1,5-diazabicyclo(4,3,0)nonene-5.

The imidazole may, for example, be specifically 2-methylimidazole, 2-ethyl-4-methylimidazole or 2-phenylimidazole.

The amount of use of the catalyst is usually from 0.001 to 1 wt % in the reaction solid content. If the alkali metal compound is used as the catalyst, the alkali metal content remains in the obtainable epoxy resin (B), and when the epoxy resin composition of the present invention containing such an epoxy resin (B) as the component is used for a printed wiring board, the insulating properties of the printed wiring board tend to be impaired. Therefore, the total content of Li, Na and K in the epoxy resin is required to be at most 60 ppm, preferably at most 50 ppm.

Further, also if the organic phosphorus compound, the tertiary amine, the quaternary ammonium salt, the cyclic amine, the imidazole or the like is used as the catalyst, such component remains as a catalyst residue in the obtainable epoxy resin (B), and in the same manner as remaining of the alkali metal content, the insulating properties of the printed wiring board are impaired. Accordingly, it is necessary that the content of nitrogen in the epoxy resin (B) is at most 300 ppm, and the content of phosphorus in the epoxy resin (B) is at most 300 ppm. More preferably, the content of nitrogen in the epoxy resin (B) is at most 200 ppm, and the content of phosphorus in the epoxy resin (B) is at most 200 ppm.

In the process for preparation reaction for production of the epoxy resin (B), an organic solvent may be used as a solvent, and the organic solvent is not limited so long as it dissolves the epoxy resin (B). It may, for example, be an aromatic type solvent, a ketone type solvent, an amide type solvent or a glycol ether type solvent.

The aromatic type solvent may, for example, be specifically benzene, toluene or xylene.

The ketone type solvent may, for example, be specifically acetone, methyl ethyl ketone, methyl isobutyl ketone, 2-heptanone, 4-heptanone, 2-octanone, cyclohexanone, acetylacetone or dioxane.

The amide type solvent may, for example, be specifically formamide, N-methylformamide, N,N-dimethylformamide, acetamide, N-methylacetamide, N,N-dimethylacetamide, 2-pyrrolidone or N-methylpyrrolidone.

The glycol ether type solvent may, for example, be specifically ethylene glycol monomethyl ether, ethylene glycol monoethyl ether, ethylene glycol mono-n-butyl ether, ethylene glycol dimethyl ether, ethylene glycol monoethyl ether acetate, diethylene glycol monomethyl ether, diethylene glycol monoethyl ether, diethylene glycol mono-n-butyl ether, diethylene glycol dimethyl ether, diethylene glycol monoethyl ether acetate, propylene glycol monomethyl ether, propylene glycol mono-n-butyl ether or propylene glycol monomethyl ether acetate.

Such organic solvents may be used alone or in combination of two or more.

The solid content concentration in the preparation reaction for production of the epoxy resin (B) is preferably from 35 to 95 wt %. Further, if a highly viscous product forms during the reaction, a solvent (organic solvent) may further be added to continue the reaction. After completion of the reaction, the solvent (organic solvent) may be removed or may further be added, as the case requires.

In production of the epoxy resin (B), the polymerization reaction of the bifunctional epoxy resin (X) with the biphenol compound (Y) is carried out at a reaction temperature to such an extent that the catalyst used is not decomposed. If the reaction temperature is too high, the epoxy resin formed may be deteriorated. On the other hand, if the temperature is too low, the reaction may not proceed sufficiently in some cases. From such reasons, the reaction temperature is preferably from 50 to 230° C., more preferably from 120 to 200° C. Further, the reaction time is usually from 1 to 12 hours, preferably from 3 to 10 hours. In a case where a low boiling point solvent such as acetone or methyl ethyl ketone is used, the reaction temperature can be secured by carrying out the reaction under high pressure using an autoclave.

[Epoxy Resin (C)]

In the present invention, the epoxy resin (B) may be used alone, but it may be used in combination with an epoxy resin having an epoxy equivalent of less than 2,500 g/equivalent (hereinafter referred to as epoxy resin (C)). By the composition containing the epoxy resin (C) in combination with the epoxy resin (B), the polymerizability of the epoxy resin component and the adhesion of a resin cured product to the filler surface tend to improve, and accordingly even when an inorganic filler (D) is contained, a cured product having sufficient cured product physical properties and thermal conductivity can be obtained.

Further, the above-described epoxy resin (B) itself is an epoxy resin which is less restricted in the curing process or the like including the curing conditions, which has sufficient extensibility and which is excellent in the balance between the thermal conductivity and the heat resistance. By using the epoxy resin (C) in combination, an epoxy resin component having fluidity and reactivity is introduced, and the mixture of the epoxy resin (B) and the epoxy resin (C) inhibits peeling of the resin on the filler surface, whereby a cured product having sufficient cured product physical properties and thermal conductivity can be obtained.

The epoxy equivalent of the epoxy resin (C) is essentially less than 2,500 g/equivalent, and from the viewpoint of the reactivity of the cured product, it is preferably less than 1,000 g/equivalent, more preferably less than 500 g/equivalent.

If the epoxy equivalent of the epoxy resin (C) is at least 2,500 g/equivalent, no cured product having sufficient cured product physical properties will be obtained.

The epoxy resin (C) is not limited so long as it is an epoxy resin which satisfies the above epoxy equivalent. Even an epoxy resin having a structure represented by the above formula (1) corresponds to the epoxy resin (C) so long as it satisfies the above epoxy equivalent. Among such epoxy resins, preferred is one having at least two epoxy groups in its molecule, and various epoxy resins such as a bisphenol A type epoxy resin, a bisphenol F type epoxy resin, a naphthalene type epoxy resin, a phenol novolak type epoxy resin, a cresol novolak type epoxy resin, a phenol aralkyl type epoxy resin, a biphenyl type epoxy resin, a triphenylmethane type epoxy resin, a dicyclopentadiene type epoxy resin, a glycidyl ester type epoxy resin, a glycidylamine type epoxy resin and a polyfunctional phenol type epoxy resin may, for example, be used.

Such epoxy resins may be used alone or as a mixture of two or more.

The epoxy resin (C) only has to satisfy the above epoxy equivalent, and its other physical properties are optional.

On the other hand, with a view to suppressing the peeling of the resin on the filler surface, the average molecular weight of the epoxy resin (C) is preferably from 100 to 5,000, more preferably from 200 to 2,000. One having an average molecular weight lower than 100 tends to be inferior in the heat resistance, and if the average molecular weight is higher than 5,000, the melting point of the epoxy resin tends to be high, thus lowering the workability.

Within a range not to impair the object of the present invention, an epoxy resin other than the epoxy resin (B) and the epoxy resin (C) (hereinafter referred to as other epoxy resin) may be contained. The content of such other epoxy resin is usually at most 50 wt %, preferably at most 30 wt % based on the total amount of the epoxy resin (B) and the epoxy resin (C).

In the composition containing the epoxy resin, the proportion of the epoxy resin (B) in all the epoxy resins including the epoxy resin (B) and the epoxy resin (C) is from 10 to 80 wt %, preferably from 10 to 70 wt % based on 100 wt % of the total amount. Here, "all the epoxy resins including the epoxy resin (B) and the epoxy resin (C)" means the epoxy resin (B) and the epoxy resin (C) in total in a case where the epoxy resins contained in the epoxy resin composition of the present invention are only the epoxy resin (B) and the epoxy resin (C), and means the epoxy resin (B), the epoxy resin (C) and other epoxy resin in total in a case where other epoxy resin is further contained.

By the proportion of the epoxy resin (B) being at least 10 wt %, a sufficient effect of improving the thermal conductivity by blending the epoxy resin (B) can be obtained, and a desired high thermal conductivity can be obtained. By the proportion of the epoxy resin (B) being less than 80 wt % and the proportion of the epoxy resin (C) being at least 20 wt %, the effect of blending the epoxy resin (C) will be obtained, and sufficient curing properties and physical properties of a cured product will be obtained.

[Flux (B)]

The interlayer filler composition of the present invention contains a flux (B), and the flux (B) in the present invention may be any compound so long as it is a compound which removes an oxide film on the surface of a metal of e.g. metal electric signal terminals such as solder bumps and lands, and which activate them to contribute to an improvement in the wettability of the molten solder. More specifically, it is a compound which has functions to dissolve and remove the surface oxide film on metal electric signal terminals such as solder bumps and lands, to improve the wettability on the land surface of the solder bumps and further, to prevent reoxidation on the metal terminal surface of the solder bumps, at the time of soldering of the metal terminals.

The flux (B) used in the present invention may, for example, be an organic carboxylic acid such as oxalic acid, malonic acid, succinic acid, glutaric acid, adipic acid, malic acid, tartaric acid, citric acid, lactic acid, acetic acid, propionic acid, butyric acid, oleic acid, stearic acid, benzoic acid, abietic acid or rosin; an organic carboxylate which is a hemiacetal ester having an organic carboxylic acid converted by reaction with an alkyl vinyl ether; an organic halogen compound such as glutamic acid hydrochloride, aniline hydrochloride, hydrazine hydrochloride, cetyl pyridine bromide, phenylhydrazine hydrochloride, tetrachloronaphthalene, methylhydrazine hydrochloride, methylamine hydrochloride, ethylamine hydrochloride, diethylamine hydrochloride or butylamine hydrochloride; an amine such as urea or diethylene triamine hydrazine, a polyhydric alcohol such as ethylene glycol, diethylene glycol, triethylene glycol, tetraethylene glycol or glycerin, an inorganic acid such as hydrochloric acid, hydrofluoric acid, phosphoric acid or fluoroboric acid; a fluoride such as potassium fluoride, sodium fluoride, ammonium fluoride, copper fluoride, nickel fluoride or zinc fluoride, a chloride such as potassium chloride, sodium chloride, cuprous chloride, nickel chloride, ammonium chloride, zinc chloride or stannous chloride; or a bromide such as potassium bromide, sodium bromide, ammonium bromide, tin bromide or zinc bromide.

These compounds may be used as they are or may be used in the form of microcapsules using a covering agent of e.g. an organic polymer or an inorganic compound. These compounds may be used alone or as a mixture of at least two in an optional combination and proportion.

Among them, in view of the solubility in the epoxy resin or various solvents, preferred is a carboxylic acid or a carboxylate. Further, in view of a low function to accelerate curing of the epoxy resin at room temperature and the storage stability of the interlayer filler composition, particularly preferred is an organic carboxylic acid or an organic carboxylate.

The organic carboxylic acid may, for example, be the above-exemplified oxalic acid, malonic acid, succinic acid, glutaric acid, adipic acid, malic acid, tartaric acid, citric acid, lactic acid, acetic acid, propionic acid, butyric acid, oleic acid, stearic acid, banzoic acid or abietic acid, and is more preferably an organic carboxylic acid having at most 12 carbon atoms, further preferably an organic carboxylic acid having at most 8 carbon atoms.

The organic carboxylate may be obtained from an organic carboxylic acid and an alkyl vinyl ether at room temperature under normal pressure or as the case requires, by heating in accordance with the following reaction formula. Since the reaction of the following reaction formula is in equilibrium, in order to increase the proportion of an organic carboxylic acid to be converted to an organic carboxylate, it is preferred to add the alkyl vinyl ether in an equivalent amount or more relative to the carboxy groups in the organic carboxylic acid to carry out the reaction:

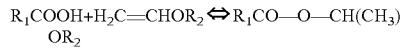

$$R_1COOH + H_2C=CHOR_2 \Leftrightarrow R_1CO-O-CH(CH_3)OR_2$$

In the above reaction formula, $R_1$ is a remaining molecular chain having one carboxy group in a carboxylic acid removed, and $R_2$ is a $C_{1-6}$ alkyl group.

The organic carboxylate is decomposed by heating to form an organic carboxylic acid and a vinyl ether in the interlayer filler composition. The organic carboxylic acid formed by the decomposition has flux properties for solder balls.

Further, some of organic carboxylic acids formed by the decomposition may have a function to cure the epoxy resin. This is because hydrogen ions released from carboxy groups by their dissociation may have a function to cure the epoxy resin. To suppress generation of hydrogen ions by dissociation of the carboxy groups, an organic carboxylate having an organic carboxylic acid protected by an alkyl vinyl ether is preferably used.

On the other hand, even when an organic carboxylate is used, if its decomposition temperature is too low, the epoxy resin may be cured at the time of temporary boding by pressure heating during the production.

Accordingly, the decomposition temperature of the organic carboxylate as the flux (B) is preferably at least 130° C. in order to avoid or suppress decomposition at the time of temporary boding, and is more preferably at least 140° C., further preferably at least 160° C., most preferably at least 180° C.

As the organic carboxylic acid as the material of the organic carboxylate, a monocarboxylic acid such as lactic acid, acetic acid, propionic acid, butyric acid, oleic acid, stearic acid, benzoic acid, abietic acid or rosin; a dicarboxylic acid such as oxalic acid, malonic acid, succinic acid, glutaric acid, adipic acid, malic acid, tartaric acid, isophthalic acid, pyromellitic acid, maleic acid, fumaric acid or itaconic acid; a tricarboxylic acid such as citric acid, 1,2,4-trimellitic acid or tris(2-carboxyethyl)isocyanurate; or a tetracarboxylic acid such as pyromellitic acid or butane tetracarboxylic acid may, for example, be used. Among them, in view of the reactivity as the flux, preferred is a polycarboxylic acid having at least two carboxy groups.

Further, as the alkyl vinyl ether as the material of the organic carboxylate, $R_2$ is preferably a $C_{1-6}$ alkyl group, particularly preferably a methyl group, an ethyl group, a propyl group or a butyl group. Among these alkyl groups, preferred is a secondary or primary alkyl group, since the lower the electron-donating properties of an alkyl group, the higher the high temperature dissociation properties.

Among such organic carboxylates, Santacid G (dialkyl vinyl ether block bifunctional polymer type carboxylic acid), Santacid H (monoalkyl vinyl ether block bifunctional low molecular weight type carboxylic acid), Santacid I (monoalkyl vinyl ether block bifunctional carboxylic acid, each manufactured by NOF Corporation), and the like may be preferably used.

In the present invention, the content of the flux (B) is at least 0.1 part by weight and at most 10 parts by weight, preferably at least 0.5 part by weight and at most 5 parts by weight per 100 parts by weight of the resin (A). If the content is less than 0.1 part by weight, solder connection failure may occur due to a decrease in the oxide film removability, and if it exceeds 10 parts by weight, connection failure may occur due to an increase in the viscosity of the composition.

[Curing Agent (C)]

In the present invention, the curing agent (C) is used as the case requires, and in a case where the resin (A) is a thermosetting resin, particularly an epoxy resin, it contributes to the crosslinking reaction at the time of formation of the resin.

The curing agent (C) is not particularly limited and a known curing agent may be used. For example, in the case of an epoxy resin, any one known as an epoxy resin curing agent may be used. It may, for example, be a phenol type curing agent, an amine type curing agent such as an aliphatic amine, a polyether amine, an alicyclic amine or an aromatic amine, an acid anhydride type curing agent, an amide type curing agent, a tertiary amine, imidazole or a derivative thereof, an organic phosphine, a phosphonium salt, a tetraphenylborate salt, an organic acid dihydrazide, a boron halide amine complex, a polymercaptan type curing agent, an isocyanate type curing agent or a blocked isocyanate type curing agent.

The phenol type curing agent may, for example, be specifically bisphenol A, bisphenol F, 4,4'-dihydroxy diphenyl methane, 4,4'-dihydroxy diphenyl ether, 1,4-bis(4-hydroxyphenoxy)benzene, 1,3-bis(4-hydroxyphenoxy)benzene, 4,4'-dihydroxy diphenyl sulfide, 4,4'-dihydroxy diphenyl ketone, 4,4'-dihydroxy diphenyl sulfone, 4,4'-dihydroxybiphenyl, 2,2'-dihydroxybiphenyl, 10-(2,5-dihydroxyphenyl)-10H-9-oxa-10-phosphaphenanthrene-10-oxide, phenol novolak, bisphenol A novolak, o-cresol novolak, m-cresol novolak, p-cresol novolak, xylenol novolak, poly-p-hydroxystyrene, hydroquinone, resorcin, catechol, t-butylcatechol, t-butylhydroquinone, phloroglucinol, pyrogallol, t-butylpyrogallol, allylated pyrogallol, polyallylated pyrogallol, 1,2,4-benzenetriol, 2,3,4-trihydroxybenzophenone, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,4-dihydroxynaphthalene, 2,5-dihydroxynaphthalene, 2,6-dihydroxynaphthalene, 2,7-dihydroxynaphthalene, 2,8-dihydroxynaphthalene, an allylated product or polyallylated product of the above dihydroxynaphthalene, allylated bisphenol A, allylated bisphenol F, allylated phenol novolak or allylated pyrogallol.

As specific examples of the amine type curing agent, the aliphatic amine may, for example, be ethylenediamine, 1,3-diaminopropane, 1,4-diaminopropane, hexamethylenediamine, 2,5-dimethylhexamethylenediamine, trimethylhexamethylenediamine, diethylenetriamine, iminobispropylamine, bis(hexamethylene)triamine, triethylenetetramine, tetraethylenepentamine, pentaethylenehexamine, N-hydroxyethylethylenediamine or tetra(hydroxyethyl) ethylenediamine. The polyether amine may, for example, be triethylene glycol diamine, tetraethylene glycol diamine, diethylene glycol bis(propylamine), polyoxypropylene diamine or polyoxypropyrene triamine. The alicyclic amine may, for example, be isophorone diamine, menthenediamine, N-aminoethylpiperazine, bis(4-amino-3-methyldicyclohexyl)methane, bis(aminomethyl)cyclohexane, 3,9-bis(3-aminopropyl)-2,4,8,10-tetraoxaspiro(5,5)undecane or norbornenediamine. The aromatic amine may, for example, be tetrachloro-p-xylene diamine, m-xylene diamine, p-xylene diamine, m-phenylenediamine, o-phenylenediamine, p-phenylenediamine, 2,4-diaminoanisole, 2,4-toluenediamine, 2,4-diaminodiphenylmethane, 4,4'-diaminodiphenylmethane, 4,4'-diamino-1,2-diphenylethane, 2,4-diaminodiphenylsulfone, 4,4'-diaminodiphenylsulfone, m-aminophenol, m-aminobenzylamine, benzyldimethylamine, 2-dimethylaminomethyl)phenol, triethanolamine, methylbenzylamine, α-(m-aminophenyl)ethylamine, α-(p-aminophenyl)ethylamine, diaminodiethyldimethyldiphenylmethane or α,α'-bis(4-aminophenyl)-p-diisopropylbenzene.

The acid anhydride type curing agent may, for example, be specifically dodecenyl succinic anhydride, polyadipic anhydride, polyazelaic anhydride, polysebacic anhydride, poly(ethyloctadecanedioic) anhydride, poly(phenylhexadecanedioic) anhydride, methyltetrahydrophthalic anhydride, methylhexahydrophthalic anhydride, hexahydrophthalic anhydride, methylhimic anhydride, tetrahydrophthalic anhydride, trialkyltetrahydrophthalic anhydride, methylcyclohexane dicarboxylic anhydride, methylcyclohexanetetracarboxylic anhydride, phthalic anhydride, trimellitic anhydride, pyromellitic anhydride, benzophenonetetracarboxylic anhydride, ethylene glycol bistrimellitate dianhydride, HET anhydride, Nadic anhydride, methyl Nadic anhydride, 5-(2,5-dioxotetrahydro-3-furanyl)-3-methyl-3-cyclohexane-1,2-dicarboxylic anhydride, 3,4-dicarboxy-1,2,3,4-tetrahydro-1-naphthalene succinic dianhydride, or 1-methyl-dicarboxy-1,2,3,4-tetrahydro-1-naphthalene succinic dianhydride.

The amide type curing agent may, for example, be dicyandiamide or a polyamide resin.

The tertiary amine may, for example, be 1,8-diazabicyclo(5,4,0)undecene-7, triethylenediamine, benzyldimethylamine, triethanolamine, dimethylaminoethanol or tris(dimethylaminomethyl)phenol.

The imidazole or its derivative may, for example, be 1-cyanoethyl-2-phenylimidazole, 2-phenylimidazole, 2-ethyl-4(5)-methylimidazole, 2-phenyl-4-methylimidazole, 1-benzyl-2-methylimidazole, 1-benzyl-2-phenylimidazole, 1-cyanoethyl-2-undecylimidazole, 1-cyano-2-phenylimidazole, 1-cyanoethyl-2-undecylimidazole trimellitate, 1-cyanoethyl-2-phenylimidazolium trimellitate, 2,4-diamino-6-[2'-methylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazine isocyanuric acid adduct, 2-phenylimidazole isocyanuric acid adduct, 2-phenyl-4,5-dihydroxymethylimidazole, 2-phenyl-4-methyl-5-hydroxymethylimidazole or an adduct of an epoxy resin with the above imidazole.

The organic phosphine may, for example, be tributylphosphine, methyldiphenylphosphine, triphenylphosphine, diphenylphosphine or phenylphosphine, the phosphonium salt may, for example, be tetraphenylphosphonium tetraphenylborate, tetraphenylphosphonium ethyltriphenylborate or tetrabutylphosphonium tetrabutylborate, and the tetraphenylborate salt may, for example, be 2-ethyl-4-methylimidazole tetraphenylborate or N-methylmorpholine tetraphenylborate.

The above curing agents may be used alone or as a mixture of at least two in optional combination and proportion.

Among the above curing agents, the imidazole or its derivative is suitably used.

In a case where as the flux (B), an organic carboxylate from which an organic carboxylic acid as the decomposition product has a function to cure the epoxy resin is used, such an organic carboxylate may be used as the curing agent (C).

The content of the curing agent (C) in the interlayer filler composition of the present invention is usually from 0.1 to 60 parts by weight per 100 parts by weight of the resin (A) particularly the epoxy resin. Here, in a case where the curing agent is a phenol type curing agent, an amine type curing agent or an acid anhydride type curing agent, it is preferably used so that the equivalent ratio of the functional groups in the curing agent and the epoxy groups in the epoxy resin is within a range of from 0.8 to 1.5. If it is out of this range, unreacted epoxy groups or functional groups in the curing agent may remain, whereby no desired physical properties may be obtained.

Further, in a case where the curing agent is an amide type curing agent, a tertiary amine, an imidazole or its derivative, an organic phosphine, a phosphonium salt, a tetraphenylborate salt, an organic acid dihydrazide, a boron halide amine complex, a polymercaptane type curing agent, an isocyanate type curing agent, a blocked isocyanate type curing agent or the like, it is preferably used in an amount of from 0.1 to 20 parts by weight per 100 parts by weigh of the epoxy resin.

[Inorganic Filler (D)]

In the present invention, by addition of an inorganic filler having a high coefficient of thermal conductivity, higher thermal conductivity can be imparted to the interlayer filler composition, whereby thermal conduction between semiconductor substrates can be accelerated and the temperature of the semiconductor device substrate can be lowered, and accordingly the semiconductor device can be operated stably, such being more favorable.

The inorganic filler (D) to be used in the present invention is preferably one having high thermal conductivity, particularly an inorganic material having a coefficient of thermal conductivity of preferably at least 1 W/mK, more preferably at least 2 W/mK.

The inorganic filler (D) preferably has a volume average particle size of from 0.1 to 5 μm and a maximum volume particle size of at most 10 μm, more preferably a volume average particle size of from 0.1 to 3 μm and a maximum volume particle size of at most 6 μm, further preferably a volume average particle size of from 0.2 to 1 μm and a maximum volume particle size of at most 3 μm.

In the above-described highly integrated three-dimensional integrated circuit, the thickness of the filling interlayer comprising the interlayer filler composition between chips is so small as from about 10 to 50 μm. Accordingly, if the maximum volume particle size of the filler to be blended in the interlayer filler composition exceeds 10 μm, the filler may protrude on the surface of the filling interlayer after curing, whereby the surface state of the filling interlayer tends to be deteriorated.

On the other hand, if the particle size of the filler is too small, the number of necessary thermally conductive paths tends to increase, whereby the probability of the thermally conductive paths being connected from top to bottom in the thickness direction between the chips tends to be low, and the coefficient of thermal conductivity in the thickness direction of the filling interlayer may be insufficient even if combined with the thermally conductive resin (A). Further, if the particle size of the filler is too small, the filler is likely to aggregate, thus deteriorating the dispersibility in the interlayer filler composition.

In the present invention, by the volume average particle size of the inorganic filler (D) being within the above range, excessive aggregation of the filler particles can be suppressed, and a filling interlayer having a sufficient coefficient of thermal conductivity in the thickness direction can be obtained.

Further, as the inorganic filler (D), at least two types of fillers differing in the volume average particle size may be used. For example, by using an inorganic filler having a relatively small volume average particle size of, for example, from 0.1 to 2 μm, preferably from 0.2 to 1.5 μm, and a filler having a relatively large volume average particle size of, for example, from 1 to 5 μm, preferably from 1 to 3 μm, in combination, the thermally conductive paths of the inorganic filler particles having a large volume average particle size are connected by the inorganic filler having a small volume average particle size, high filling becomes possible as compared with a case of using only one having a single volume average particle size, and higher thermal conductivity can be obtained.

In such a case, it is preferred to use an inorganic filler having a small volume average particle size and an inorganic filler having a large volume average particle size in a weight ratio of from 10:1 to 1:10, in view of formation of thermally conductive paths.

In the present invention, if the inorganic material used as the inorganic filler (D) is a commercially available product or may be immediately after preparation, the powder aggregates, whereby the above particle size range is not satisfied in some cases. Accordingly, the inorganic material used as the inorganic filler (D) is preferably ground so that the above particle size range is satisfied.

The method of grinding the inorganic material is not particularly limited, and a method of stirring and mixing it with grinding media such as zirconia beads, or a known grinding method such as jet spraying may be applied. Further, the inorganic filler (D) may be properly subjected to surface treatment to increase the dispersibility in the resin (A) or in the coating fluid.

The inorganic filler (D) may, for example, be alumina ($Al_2O_3$, coefficient of thermal conductivity: 30 W/mK), aluminum nitride (AlN, coefficient of thermal conductivity: 260 W/mK), boron nitride (BN, coefficient of thermal conductivity: 3 W/mK (thickness direction), 275 W/mK (in-plane direction)), silicon nitride ($Si_3N_4$, coefficient of thermal conductivity: 23 W/mK) or silica ($SiO_2$, coefficient of thermal conductivity: 1.4 W/mK). The inorganic filler preferably further has stability against oxygen, water or high temperature exposure and low dielectric property in view of the reliability of a device bonded, and such an inorganic filler is preferably $Al_2O_3$, AlN, BN or $SiO_2$, especially preferably BN.

Such inorganic fillers (D) may be used alone or as a mixture of at least two in optional combination and proportion.

In the present invention, the content of the inorganic filler (D) is at least 50 parts by weight and at most 400 parts by weight, preferably at least 75 parts by weight and at most 300 parts by weight per 100 parts by weight of the resin (A). By such a content, the interlayer filler composition of the present invention has sufficient thermal conductivity and has a viscosity to such an extent that a uniform coating film can be formed.

If the content of the inorganic filler (D) is less than 50 parts by weight, no sufficient thermal conductivity may be obtained in some cases, and if it exceeds 400 parts by weight, the viscosity of the composition tends to be high, and such a problem may arise that no uniform coating film may be formed.

Further, the interlayer filler composition of the present invention may contain a filler other than the inorganic filler (D) (hereinafter referred to as other filler) for the purpose of adjusting the viscosity or for another purpose, within a range not to impair the effects of the present invention. For example, in a case where the filler is added for the purpose of adjusting the viscosity, not for the purpose of improving the thermal conductivity, silica ($SiO_2$, coefficient of thermal conductivity: 1.4 W/mK) which is a general purpose filler, the coefficient of thermal conductivity of which is not so high, may be used.

On the other hand, the volume average particle size and the maximum volume particle size of such other filler are preferably within the same range as the inorganic filler (D).

{Other Additives}

The interlayer filler composition of the present invention may contain various additives for the purpose of further improving its functions, within a range not to impair the effects of the present invention.

Such other additives may, for example, be a coupling agent such as a silane coupling agent or a titanate coupling agent, as an additive component to improve the bonding property to a substrate or the bonding property between the matrix resin and the inorganic filler, an ultraviolet inhibitor to improve the storage stability, an antioxidant, a plasticizer, a flame retardant, a coloring agent, a dispersing agent, a fluidity-improving agent or an agent to improve the adhesion to a substrate.

Each of these additives may be used alone or as a mixture of at least two in optional combination and proportion.

Among the above additives, with a view to improving the adhesion between the resin (A) and the inorganic filler (D), a coupling agent such as a silane coupling agent or a titanate coupling agent is preferably contained.

The silane coupling agent may, for example, be an epoxysilane such as γ-glycidoxypropyltrimethoxysilane, γ-glycidoxypropyltriethoxysilane or β-(3,4-epoxycyclohexyl)ethyltrimethoxysilane; an aminosilane such as γ-aminopropyltriethoxysilane, N-β(aminoethyl)γ-aminopropyltrimethoxysilane, N-β(aminoethyl)γ-aminopropylmethyldimethoxysilane, γ-aminopropyltrimethoxysilane or γ-ureido propyltriethoxysilane; a mercaptosilane such as 3-mercaptopropyltrimethoxysilane; a vinylsilane such as p-styryltrimethoxysilane, vinyltrichlorosilane, vinyltris(β-methoxyethoxy)silane, vinyltrimethoxysilane, vinyltriethoxysilane or γ-methacryloxypropyltrimethoxysilane, or a polymer type silane such as an epoxy type, an amino type or a vinyl type.

The titanate coupling agent may, for example, be isopropyltriisostearoyl titanate, isopropyltri(N-aminoethyl-aminoethyl)titanate, diisopropylbis(dioctyl phosphate)titanate, tetraisopropylbis(dioctyl phosphite)titanate, tetraoctylbis(ditridecyl phosphite)titanate, tetra(2,2-diallyloxymethyl-1- butyl)bis(ditridecyl)phosphite titanate, bis(dioctyl pyrophosphate)oxyacetate titanate or bis(dioctyl pyrophosphate)ethylene titanate.

The amount of such other additives is not particularly limited, and they are used in amounts for a conventional resin composition to such an extent that necessary functions are obtained.

Among such other additives, the addition amount of the coupling agent is preferably from about 0.1 to about 2.0 wt % to the total solid content in the interlayer filler composition. If the amount of the coupling agent is small, no sufficient effect of improving the adhesion between the matrix resin and the inorganic filler (D) by blending the coupling agent may be obtained, and if it is too large, the coupling agent may bleed out from the obtainable cured product.

Further, to the interlayer filler composition of the present invention, a thermoplastic oligomer may be added with a view to improving the fluidity at the time of forming and improving the adhesion to the substrate. The thermoplastic oligomer may, for example, be a C5 or C9 petroleum resin, a styrene resin, an indene resin, an indene/styrene copolymer resin, an indene/styrene/phenol copolymer resin, an indene/coumarone copolymer resin, an indene/benzothiophene copolymer resin. The addition amount is usually within a range of from 2 to 30 parts by weight per 100 parts by weight of the resin (A).

{Coating Fluid}

The coating fluid of an interlayer filler composition for a three-dimensional integrated circuit of the present invention (hereinafter referred to simply as coating fluid of the present invention) comprises the interlayer filler composition, i.e., the resin (A) and the flux (B) and as the case requires, the curing agent (C) and the inorganic filler (D), and further contains an organic solvent (E).

[Organic Solvent (E)]

The organic solvent (E) used for the coating fluid of the present invention may, for example, be a ketone such as acetone, methyl ethyl ketone (MEK), methyl isobutyl ketone, methyl amyl ketone or cyclohexanone, an ester such as ethyl acetate; an ether such as ethylene glycol monomethyl ether; an amide such as N,N-dimethylformamide or N,N-dimethylacetamide; an alcohol such as methanol or ethanol; an alkane such as hexane or cyclohexane; or an aromatic compound such as toluene or xylene.

Among them, considering the solubility of the resin (A), the boiling point of the solvent, and the like, preferred is a ketone such as methyl ethyl ketone or cyclohexanone, an ester or an ether, particularly preferred is a ketone such as methyl ethyl ketone or cyclohexanone.

Such organic solvents (E) may be used alone or as a mixture of at least two in optional combination and proportion.

The mixing ratio of the organic solvent (E) to the other components in the coating fluid of the present invention is not particularly limited, but is preferably at least 20 wt % and at most 70 wt %, particularly preferably at least 30 wt % and at most 60 wt % to the other components. By using the coating fluid of the present invention having such a mixing ratio, a favorable coating film can be formed by an optional coating method.

If the mixing ratio of the organic solvent (E) is less than 20 wt %, the viscosity of the coating fluid tends to increase, and no favorable coating film may be obtained in some cases, and if it exceeds 70 wt %, problems may arise such that no predetermined film thickness will be obtained.

The coating fluid of the present invention may contain various additives.

Such additives may, for example, be the above-described additives, and a surfactant to improve the dispersibility of the respective components in the coating fluid, an emulsifier, an elasticity-lowering agent, a diluent, an antifoaming agent or an ion trapping agent.

As the surfactant, any one of known anionic surfactant, nonionic surfactant and cationic surfactant may be used.

For example, a polyoxyethylene alkyl ether, a polyoxyethylene alkyl aryl ether, a polyoxyethylene alkyl ester, a sorbitan alkyl ester, a monoglyceride alkyl ester, an alkylbenzene sulfonate, an alkylnaphthalene sulfonate, an alkyl sulfate, an alkyl sulfonate, a sulfosuccinate, an alkylbetain or an amino acid may, for example, be mentioned.

Further, a fluorinated surfactant having some or all of CH bonds in such a surfactant converted to CF bonds may also be preferably used.

The amount of addition of the surfactant is preferably about 0.001 to 5 wt % to all the solid content in the interlayer filler composition. If it is less than 0.001 wt %, no desired film thickness uniformity may be obtained in some cases, and if it exceeds 5 wt %, phase separation with the epoxy resin component may occur in some cases, such being unfavorable.

The method for producing the coating fluid of the present invention is not particularly limited, and the coating fluid of the present invention may be produced by a known method by mixing the constituting components for the coating fluid. On that occasion, for the purpose of improving the uniformity of the composition, degassing, and the like, it is preferred to mix the components by using e.g. a paint shaker, a bead mill, a planetary mixer, a stirring type dispersing machine, a rotary and revolutionary stirring mixing machine, or a three-roll mill.

Unless there are some special problems such as the reaction or formation of precipitates, the order of mixing the respective components is optional, and any two or more components among the components constituting the coating fluid may be preliminarily blended and then the other components are mixed, or all the components may be mixed all at once.

As described above, the inorganic filler (D) is preferably not in the form of aggregates having large particle sizes, and accordingly it may be ground before production of the coating fluid, or may be ground after mixed with other components. The method of grinding the inorganic material is not particularly limited, and a conventional grinding method may be employed.

{Process for Producing Three-Dimensional Integrated Circuit}

Now, the process for producing a three-dimensional integrated circuit using the interlayer filler composition of the present invention or the coating fluid of the interlayer filler composition will be described below. This process comprises a step of forming a film of the interlayer filler composition on a plurality of semiconductor substrates, and laminating such semiconductor substrates by pressure bonding.

In the present invention, first, a thin film of the interlayer filler composition is formed on a semiconductor substrate. In a case where the coating fluid of the interlayer filler composition of the present invention is used, by using the coating fluid, a coating film can be formed by a dipping method, a spin coating method, a spray coating method, a blade coating method or another optional method. To remove the solvent and low molecular weight components from the obtained coating film, baking treatment is carried out at an optional temperature of from 50 to 150° C. to form a B-stage film. On that occasion, baking treatment may be carried out at a certain temperature, or baking treatment may be carried out under reduced pressure conditions so that removal of volatile components in the composition smoothly proceeds. Further, within a range where curing of the epoxy resin does not proceed, a baking treatment by stepwise temperature increase may be carried out. For example, a baking treatment initially at 60° C., then at 80° C. and further at 120° C. each for from about 5 to about 30 minutes may be carried out.

Further, without using the coating fluid of the present invention, the interlayer filler composition of the present invention may be used as it is. For example, using the interlayer filler composition heated and melted within a temperature range within which curing of the resin does not start, a film of the interlayer filler composition may be formed on a semiconductor substrate by an optional method.

Further, since the interlayer filler composition of the present invention has sufficient extensibility suitable for film formation, the interlayer filler composition of the present invention may be formed into a film, and the film is placed on a semiconductor substrate.

Then, the film comprising the interlayer filler composition formed by the above method is heated to develop tack properties, and temporary boding to a semiconductor substrate to be bonded is carried out. The temporary boding temperature depends on the composition of the resin (A) and is preferably from 80 to 150° C. In a case where a plurality of semiconductor substrates are to be bonded, temporary bonding may be repeatedly carried out for the respective substrates, or a plurality of substrates having the B-stage film formed thereon are overlaid, and they are temporarily bonded by heating all together. For the temporary boding, as the case requires, a load of from 1 gf/cm$^2$ to 1 Kgf/cm$^2$ is preferably applied to the substrates.

After the temporary boding, main bonding of the semiconductor substrates is carried out. The temporarily boded semiconductor substrates were pressure bonded at 200° C. or higher, preferably at 220° C. or higher, whereby the melt viscosity of the resin in the interlayer filler composition is lowered to accelerate connection of electric terminals between the semiconductor substrates and at the same time, the flux in the composition is activated to realize solder bonding between the semiconductor substrates. The upper limit of the heating temperature is a temperature at which the epoxy resin used is not decomposed or denatured, is properly determined by the type and the grade of the resin, and is usually at most 300° C.

Further, at the time of main boding, as the case requires, a load of from 10 gf/cm$^2$ to 10 Kgf/cm$^2$ is preferably applied to the substrates.

EXAMPLES

Now, the present invention will be described in further detail with reference to Examples. However, it should be understood that the present invention is by no means restricted to the following Examples within the scope of the present invention.

The components blended in each of interlayer filler compositions used in Examples 1 to 3 and Comparative Examples 1 to 3 are as follows.

Epoxy Resin
Epoxy resin (A1):
  phenoxy resin
  weight average molecular weight: 26,000
  epoxy equivalent: 4,600 g/equivalent
  A mixed solution of 30 wt % methyl ethyl ketone/ cyclohexanone in a weight ratio of 1:1
Epoxy resin (A2):
  "157S65", tradename, manufactured by Mitsubishi Chemical Corporation
  80.6 wt % MEK solution
  softening point: 65° C.
  melt viscosity at 150° C.: 0.3 Pa·s Flux (B): "Santacid G", tradename, manufactured by NOF Corporation, dialkyl vinyl ether block bifunctional polymer type carboxylic acid Curing agent (C): "C11Z-CN", tradename, manufactured by SHIKOKU CHEMICALS CORPORATION 1-cyanoethyl-2-undecylimidazole Inorganic filler (D): boron nitride BN manufactured by NISSIN REFRATECH CO., LTD. (coefficient of thermal conductivity: 3 W/mK (thickness direction), 275 W/mK (in-plane direction))
  Organic solvent (E)
  Organic solvent (E1): special grade chemicals methyl ethyl ketone manufactured by Wako Pure Chemical Industries, Ltd. (hereinafter sometimes abbreviated as MEK)
  Organic solvent (E2): special grade chemicals cyclohexanone manufactured by Wako Pure Chemical Industries, Ltd. (hereinafter sometimes abbreviated as CHN)

The phenoxy resin as the epoxy resin (A1) was prepared as follows.

215 parts by weight of YL6121H (epoxy equivalent: 171 g/equivalent, a 1:1 mixture of 4,4'-biphenol type epoxy resin and 3,3',5,5'-tetramethyl-4,4'-biphenol type epoxy resin, manufactured by Mitsubishi Chemical Corporation), 127 parts by weight of 3,3'-dimethyl-4,4'-biphenol (OH equivalent: 107 g/equivalent, manufactured by Honshu Chemical Industry Co., Ltd.), 0.32 part by weight of a 27 wt % tetramethylammonium hydroxide aqueous solution and 228 parts by weight of cyclohexanone as a reaction solvent were put in a pressure resistant reactor equipped with a stirrer, and a reaction was carried out in a nitrogen gas atmosphere at 180° C. for 5 hours. Then, 171 parts by weight of cyclohexanone and 399 parts by weight of methyl ethyl ketone as solvents for dilution were added to adjust the solid content concentration. The solvents were removed from the reaction product by an usual method to obtain a 30 wt % resin solution.

Physical properties of the epoxy resin, the electric resistance of solder bumps at the time of evaluation of bonding and the particle size of the inorganic filler were measured as follows.

(1) Melt Viscosity

The melt viscosity (parallel plate dynamic viscosity) was measured by using viscoelasticity measuring apparatus Physica MCR301 manufactured by Anton Paar Japan.

First, the solvents were removed from the epoxy resin to be measured to obtain a solid, followed by press forming of the solid to obtain a plate sample having a thickness of about 1 mm. This sample was placed between a parallel plate dish and a parallel plate (25 mm in diameter) and the parallel plate dynamic viscosity was measured.

As the measurement conditions, 20% of sine wave distortion was applied to the above sample, the angular frequency of the distortion was 10 rad/sec, and the viscosity in a step of raising the temperature at a rate of 3° C. per minute was measured at from 40° C. to 200° C.

(2) Coefficient of Thermal Conductivity

By the following apparatus, the thermal diffusivity, the specific gravity and the specific heat were measured, and these three measured values were multiplied to obtain the coefficient of thermal conductivity.

1) Thermal diffusivity: "ai-Phase Mobile 1u" manufactured by ai-Phase Co., Ltd.

2) Specific gravity: balance XS-204 manufactured by Mettler-Toredo International Inc. (using "solid specific gravity measuring kit")

3) Specific heat: DSC320/6200 manufactured by Seiko Instruments Inc.

(3) Electric Resistance

The resistance between terminals was measured by FLUKE77 multimeter (JOHN FLUKE MFG. Co. INC).

(4) Particle Size Measurement

A sample (see Example 1) after stirring and mixing was dispersed in cyclohexanone, and the particle size was measured by a laser diffraction/scattering type particle size distribution measuring apparatus LA-920 manufactured by HORIBA, Ltd. From the obtained particle size distribution, the volume average particle size and the maximum volume particle size of the inorganic filler (D) after grinding were determined.

Examples 1 and 2 and Comparative Examples 1 and 2

As the epoxy resin, epoxy resin (A1) and epoxy resin (A2) in a predetermined blend weight ratio (20:80 as the resin excluding the solvents) were used, in a total amount of the epoxy resin (A) of 100 parts by weight. The melt viscosity of the epoxy resin was 3000 Pa·s (50° C.) and 16 Pa·s (120° C.). With 100 parts by weight of the epoxy resin, flux (B), organic solvent (E) (a mixture of methyl ethyl ketone (E1) and cyclohexanone (E2) in a blend weight ratio of 35:65) and curing agent (C) were blended in a weight ratio as identified in Table 1. Then, using a rotary and revolutionary stirring machine, the mixture was stirred and kneaded at 1,000 rpm for 5 minutes to obtain a material paste for the interlayer filler.

This material paste was applied on an area of 10 mm×10 mm (about 8,500 bumps) on the solder bump substrate as shown in FIGS. 1(a) and (b) so that the film thickness became 50 μm, and heated at 120° C. for one minute to distil the solvent off to form a B-stage film. This substrate was heated again at 120° C., and to the coated area, a copper surface of a copper substrate was pressed against the coated area face with a load of 0.1 Kgf/cm² to carry out temporary bonding. After cooling to room temperature, the temporarily bonded substrates were subjected to heat pressing at 120° C. using a small pressing machine under a load of 10 Kgf/cm² for 10 minutes.

Then, the substrates were subjected to heat pressing on a hot plate at 250° C. under a load of 0.1 Kgf/cm² for one minute. Each after pressing at 120° C. and after pressing at 250° C., the electric resistance was measured to evaluate bonding properties between the solder bump substrate and the copper substrate. The results are shown in Table 1.

From Table 1, the electric resistance between the solder bump substrate and the copper substrate each after the temporary bonding and after pressing at 120° C. was several Ω or higher, whereas the electric resistance after pressure bonding at a temperature of at least 200° C. was at most 1Ω in each Example. Further, when the composition contained the flux, the electric resistance between the substrates was less than 0.1Ω in each Example, and a low resistance was achieved even when the solder bump substrate and the copper substrate were bonded via the interlayer filler composition, and it is found that favorable bonding state can be realized.

TABLE 1

| | Organic solvent (E) (Parts by weight) | Epoxy resin (A) (Parts by weight) | Flux (B) (Parts by weight) | Curing agent (C) (Parts by weight) | Resistance by bonding (Ω) | | |
|---|---|---|---|---|---|---|---|
| | | | | | After B-stage formation | After pressing at 120° C. | After pressing at 250° C. |
| Ex. 1 | 124 | 100 | 2.0 | — | 34.7 | 5.4 | <0.1 |
| Ex. 2 | 124 | 100 | 2.0 | 0.1 | 6 | 2.8 | <0.1 |
| Comp. Ex. 1 | 122 | 100 | — | — | ∞ | 778 | 1 |
| Comp. Ex. 2 | 122 | 100 | — | 0.1 | 15.2 | 2.7 | 0.6 |

Reference Examples 1 to 16

Each of various fluxes (B) and organic solvent (E) (a mixture of methyl ethyl ketone (E1) and cyclohexanone (E2) in a blend weight ratio of 35:65) were blended in the weight concentration as identified in Table 2, stirred and mixed to obtain a flux solution.

Chemicals used are as follows.

Rosin (abietic acid mixture, manufactured by Wako Pure Chemical Industries, Ltd.), Santacid G to I (organic carboxylic acid derivative, manufactured by NOF Corporation), 2E4MZ (2-ethyl-4-methylimidazole, manufactured by SHIKOKU CHEMICALS CORPORATION), C11Z-CN (1-cyanoethyl-2-undecylimidazole, manufactured by SHIKOKU CHEMICALS CORPORATION)

50 μL of the flux solution was dropped on a copper substrate of 10 mm×10 mm, and solder balls (Sn3.0Ag0.5Cu, diameter: 300 μm) were added to the flux droplets. This substrate was heated on a hot plate at 120° C. for one minute to distill the solvent off. Then, this substrate was heated at 250° C. for 10 seconds on a hot plate at 250° C., and the melting properties of the solder balls to the copper substrate were evaluated. The results are shown in Table 2.

From Table 2, in a case where an organic carboxylic acid or an organic carboxylate was used as the flux, the solder balls were melted at a predetermined temperature and favorably bonded to the copper substrate. On the other hand, an amino acid has low solubility in the solvent, and the imidazole has a low function as the flux, and the solder balls could not be bonded to the copper substrate.

TABLE 2

| | Solvent (wt %) | Flux (wt %) | Type of flux | Solder ball melting properties |
|---|---|---|---|---|
| Ref. Ex. 1 | 99 | 1 | Malonic acid | ○ |
| Ref. Ex. 2 | 99 | 1 | Succinic acid | ○ |

TABLE 2-continued

| | Solvent (wt %) | Flux (wt %) | Type of flux | Solder ball melting properties |
|---|---|---|---|---|
| Ref. Ex. 3 | 99 | 1 | Adipic acid | ○ |
| Ref. Ex. 4 | 99 | 1 | Malic acid | ○ |
| Ref. Ex. 5 | 99 | 1 | Tartaric acid | ○ |
| Ref. Ex. 6 | 99 | 1 | Citric acid | ○ |
| Ref. Ex. 7 | 95 | 5 | Abietic acid | ○ |
| Ref. Ex. 8 | 95 | 5 | Rosin | ○ |
| Ref. Ex. 9 | 99 | 1 | Santacid G | ○ |
| Ref. Ex. 10 | 95 | 5 | Santacid H | ○ |
| Ref. Ex. 11 | 95 | 5 | Santacid I | ○ |
| Ref. Ex. 12 | 99 | 1 | Glycin | X |
| Ref. Ex. 13 | 99 | 1 | Alanine | X |
| Ref. Ex. 14 | 99 | 1 | Glutamic acid | X |
| Ref. Ex. 15 | 95 | 5 | 2E4MZ | X |
| Ref. Ex. 16 | 95 | 5 | C11Z-CN | X |

Santacid G: dialkyl vinyl ether block bifunctional polymer type carboxylic acid
Santacid H: monoalkyl vinyl ether block bifunctional low molecular weight type carboxylic acid
Santacid I: monoalkyl vinyl ether block bifunctional carboxylic acid
2E4MZ: 2-ethyl-4-methylimidazole
C11Z-CN: 1-cyanoethyl-2-undecylimidazole Example 3

4.7 g of the above epoxy resin (A1) solution and 7 g of the epoxy resin (A2) solution (blend weight ratio of 20:80 as the resin excluding the solvent, the melt viscosity of the epoxy resin was 3,000 Pa·s (50° C.) and 16 Pa·s (120° C.)) and 0.7 g of a 5% cyclohexanone solution of curing agent (C) were mixed to obtain an epoxy resin solution.

This resin solution was applied to a separator (a silicone-treated polyethylene terephthalate film, thickness: 100 μm) by a doctor blade, heated at 60° C. for 15 minutes, then at 80° C. for 15 minutes and then at 80° C. for 15 minutes under reduced pressure (pressure<4 Torr) to remove the solvent to form a B-stage film. Then, another separator was placed on the obtained B-stage film, and formed and cured by pressing under pressure (pressure: 1 MPa) at 100° C. for 15 minutes, then at 150° C. for 15 minutes and then at 200° C. for 30 minutes to obtain a cured film having a film thickness of about 50 μm. The coefficient of thermal conductivity of the obtained epoxy resin was 0.22 W/mK.
(Preparation and Evaluation of Interlayer Filler Composition)

4.7 g of the above epoxy resin (A1) solution and 7 g of the epoxy resin (A2) solution as the epoxy resin (blend weight ratio of 20:80 as the resin excluding the solvent, the melt viscosity of the epoxy resin was 3,000 Pa·s (50° C.) and 16 Pa·s (120° C.)), 19.8 g of inorganic filler (D) and 20.5 g of organic solvent (E) were put in a SUS container (with a glass lid). 300 g of zirconia balls (YTZ-2) having a diameter of 2 mm were added while being rotated at 550 rpm by a SUS stirring blade, followed by stirring for 5 hours to grind inorganic filler (D). After completion of stirring, 0.7 g of a 5% cyclohexanone solution of curing agent (C) was added, followed by stirring further for 5 minutes. After stirring, the zirconia balls were removed by filtration, to obtain an interlayer filler paste (coating fluid).

Figure 2:
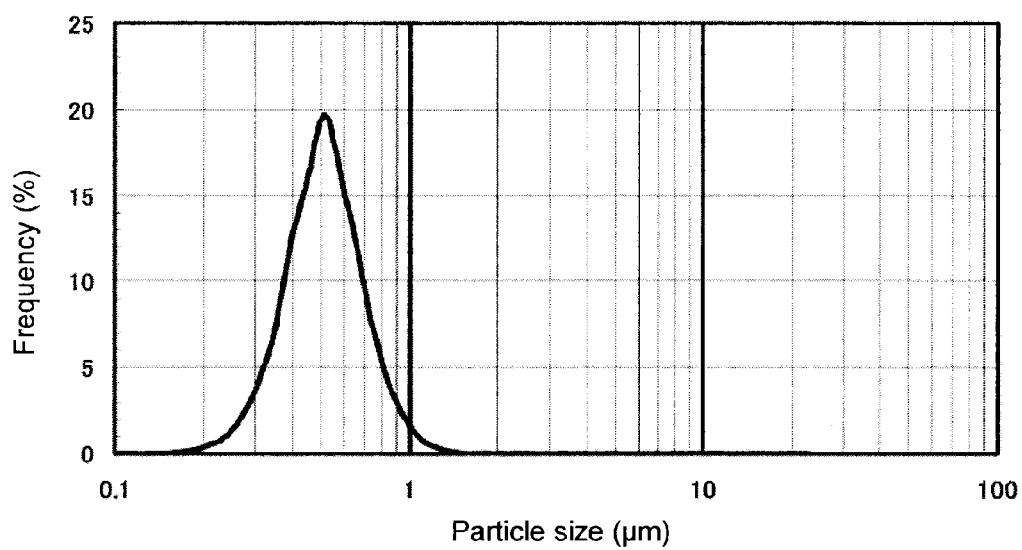
FIG. 2 illustrates results of evaluation of the particle size distribution of the interlayer filler paste in Example 3.

The particle size distribution of inorganic filler (D) in the obtained interlayer filler paste after grinding is shown in FIG. 2. The volume average particle size of inorganic filler (D) obtained from the particle size distribution was 0.5 μm, and the maximum volume particle size was 1.5 μm.

Figure 3:
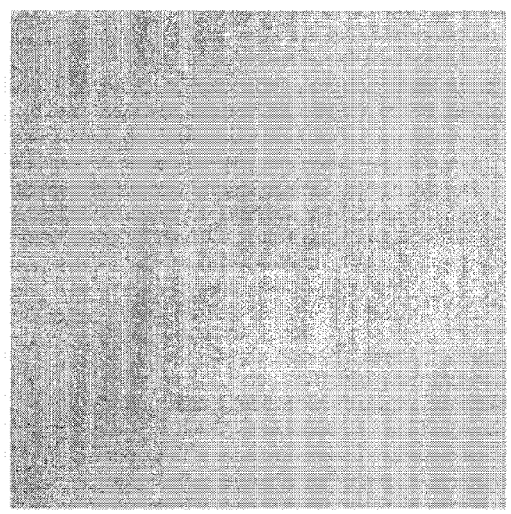
FIG. 3 is a photograph illustrating the surface of a B-stage film obtained from the interlayer filler paste in Example 3.

This paste was applied to a substrate by a spin coater (manufactured by MIKASA CO., LTD.) and dried by heating at 80° C. for 15 minutes and at 120° C. for 15 minutes to form a B-stage film. The obtained B-stage film was visually uniform as shown in FIG. 3.

Comparative Example 3

4.7 g of the epoxy resin (A1) solution and 7 g of the epoxy resin (A2) solution as the epoxy resin (blend weight ratio of 20:80 as the resin excluding the solvent, the melt viscosity of the epoxy resin was 3,000 Pa·s (50° C.) and 16 Pa·s (120° C.)), 19.8 g of inorganic filler (D), 0.7 g of curing agent (C) (5% cyclohexanone solution) and 20.5 g of organic solvent (E) were put in a SUS container (with a glass lid), followed by stirring by a SUS stirring blade at 550 rpm for 5 minutes to obtain an interlayer filler paste.

Figure 4:
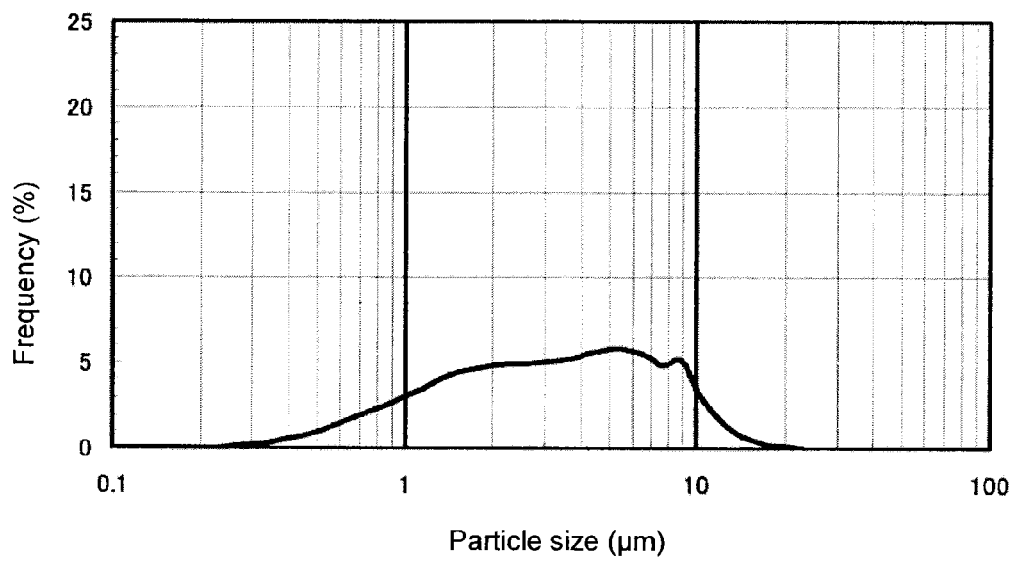
FIG. 4 illustrates results of evaluation of the particle size distribution of the interlayer filler paste in Comparative Example 3.

The particle size distribution of the interlayer filler paste was measured by the same apparatus as in Example 3, and the obtained results are shown in FIG. 4. The volume average particle size of inorganic filler (D) obtained from the particle size distribution was 4.0 μm, and the maximum volume particle size was 20 μm.

Figure 5:
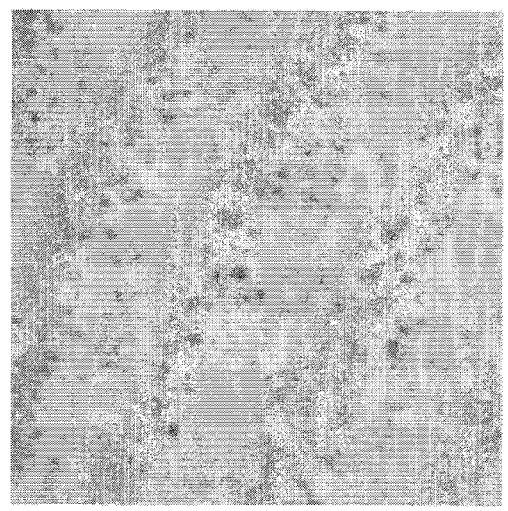
FIG. 5 is a photograph illustrating the surface of a B-stage film obtained from the interlayer filler paste in Comparative Example 3.

Using the interlayer filler paste, a B-stage film was obtained in the same manner as in Example 3. On the obtained B-stage film, many spots of the filler were visually observed as shown in FIG. 5, and the film was non-uniform.

Preparation Examples 1 to 3

Evaluation of epoxy resin (B) in these Preparation Examples was carried out by the following method.
<Molecular Weight>

Using a high performance GPC apparatus ("HLC-8320GPC EcoSEC" (registered trademark) manufactured by TOSOH CORPORATION), under the following measuring conditions, using as standard polystyrene, TSK Standard Polystyrene:F-128 (Mw1,090,000, Mn1,030,000), F-10 (Mw106,000, Mn103,000), F-4 (Mw43,000, Mn42,700), F-2 (Mw17,200, Mn16,900), A-5000 (Mw6,400, Mn6,100), A-2500 (Mw2,800, Mn2,700), A-300 (Mw453, Mn387), an analytical curve was prepared, and the weight average molecular weight and the number average molecular weight as calculated as polystyrene were measured.

Column: "TSKGEL SuperHM-H+H5000+H4000+H3000+H2000" manufactured by TOSOH CORPORATION
Eluent: tetrahydrofuran
Flow rate: 0.5 ml/min
Detection: UV (wavelength: 254 nm)
Temperature: 40° C.
Sample concentration: 0.1 wt %
Injection amount: 10 μL
<Number of n>

The value of n and its average value in the formula (1) representing the epoxy resin (B) were calculated from the above-determined number average molecular weight.
<Epoxy Equivalent>

Measured in accordance with JIS K 7236, and represented as a value calculated as solid content.
<Glass Transition Temperature Tg>

Measured by heating an epoxy resin from which the solvent was removed by drying, at 10° C./min from 30 to 200° C. using "DSC7020" manufactured by SII Nanotechnology Inc.
<Extension>

A solution of the epoxy resin was applied to a separator (a silicone-treated polyethylene terephthalate film, thickness: 100 μm) by an applicator, dried at 60° C. for 1 hour, then at 150° C. for 1 hour and further at 200° C. for 1 hour to obtain an epoxy resin film having a thickness of about 50 μm. This film was cut into a width of 1 cm, and the extension was measured by a precision universal testing machine (INSTRON 5582 model manufactured by INSTRON) at 5 mm/min three times, and the average value was shown.

Further, the coefficient of thermal conductivity of the epoxy resin (B1) film used in the following Examples and the cured film obtained in Examples and Comparative Examples was evaluated by the following methods. The epoxy resin (B1) film was obtained in the same manner as for the above sample for measuring extension.

<Coefficient of Thermal Conductivity>

The thermal diffusivity, the specific gravity and the specific heat were measured by the following apparatus, and these three measured values were multiplied to obtain the coefficient of thermal conductivity.

Thermal diffusivity: "ai-Phase Mobile 1 u" manufactured by ai-Phase Co., Ltd.

Specific gravity: "balance XS-204" manufactured by Mettler-Toredo International Inc. (using "solid specific gravity measuring kit")

<Compound (X)>
(X-A): "YL6121H", tradename, manufactured by Mitsubishi Chemical Corporation (a 1:1 mixture of 4,4'-biphenol type epoxy resin and 3,3',5,5'-tetramethyl-4,4'-biphenol type epoxy resin, epoxy equivalent: 171 g/equivalent)
(X-B): "YX4000", tradename, manufactured by Mitsubishi Chemical Corporation (3,3',5,5'-tetramethyl-4,4'-biphenol diglycidyl ether, epoxy equivalent: 186 g/equivalent)

<Compound (Y)>
(Y-A): 3,3'-dimethyl-4,4'-biphenol (OH equivalent: 107 g/equivalent, manufactured by Honshu Chemical Industry Co., Ltd.)
(Y-B): 3,3',5,5'-tetramethyl-4,4'-biphenol (OH equivalent: 121 g/equivalent)

<Catalyst>
(C-1): 27 wt % tetramethylammonium hydroxide aqueous solution

<Solvent>
(S-1): cyclohexanone
(S-2): methyl ethyl ketone
(S-3): N,N'-dimethylacetamide

TABLE 3

Blend ratio and analysis results of epoxy resin

|  |  |  | Prep. Ex. 1 | Prep. Ex. 2 | Prep. Ex. 3 |
|---|---|---|---|---|---|
| Blend ratio | Compound (X) | Type | (X-A) | (X-A) | (X-B) |
|  |  | Amount (parts by weight) | 210 | 215 | 80 |
|  | Compound (Y) | Type | (Y-A) | (Y-A) | (Y-B) |
|  |  | Amount (parts by weight) | 127.6 | 126.9 | 51.0 |
|  | Compound (X):compound (Y) equivalent ratio (epoxy groups:phenolic hydroxy groups) |  | 1.03:1 | 1.06:1 | 1.02:1 |
|  | Catalyst | Type | (C-1) | (C-1) | (C-1) |
|  |  | Amount (parts by weight) | 0.78 | 0.32 | 0.59 |
|  | Solvent (for reaction) | Type | (S-1) | (S-1) | (S-1) |
|  |  | Amount (parts by weight) | 181.8 | 227.9 | 87.4 |
|  | Solvent (for dilution) | Type | (S-1) | (S-1) | (S-1) |
|  |  | Amount (parts by weight) | 212.1 | 171 | 65.5 |
|  |  | Type | (S-2) | (S-2) | (S-2) |
|  |  | Amount (parts by weight) | 393.8 | 399 | 152.9 |
|  |  | Solid content concentration (wt %) | 30 | 30 | 30 |
| Analysis results |  | Weight average molecular weight | 59741 | 26425 | 35461 |
|  |  | Number average molecular weight | 13625 | 8129 | 11968 |
|  |  | Value of n in formula (1) | 49 | 29 | 40 |
|  |  | Epoxy equivalent (g/equivalent) | 8150 | 4586 | 7991 |
|  |  | Tg (° C.) | 110 | 103 | 130 |
|  |  | Extension (%) | 72 | 10 | 13 |
|  |  | Coefficient of thermal conductivity (W/mK) | 0.21 | 0.23 | 0.20 |

Specific heat: "DSC320/6200" manufactured by Seiko Instruments Inc.

[Production and Evaluation of Epoxy Resin (B)]

Preparation Examples 1 to 3

Compound (X), compound (Y), catalyst and a reaction solvent in a blend ratio as identified in Table 3 were put in a pressure resistant reactor equipped with a stirrer, reaction was carried out in a nitrogen gas atmosphere at 180° C. for 5 hours, and a solvent for dilution was added to adjust the solid content concentration. The solvents were removed from the reaction product by an usual method, and the obtained resin was analyzed. The results are shown in Table 3.

The compounds, catalyst and solvents used for the reaction were as follows.

[Production and Evaluation of Epoxy Resin Composition]

Reference Example 4

2.5 g (resin content: 0.75 g, 60 parts by weight) of the epoxy resin (Mw 59,741) obtained in Preparation Example 1, 0.625 g (resin content: 0.5 g, 40 parts by weight) of a bisphenol A novolak type polyfunctional epoxy resin solution ("157S65(B80)", tradename, manufactured by Mitsubishi Chemical Corporation) and 0.032 g (curing agent weight: 0.00625 g, 0.5 part by weight) of a 20 wt % solution (solvent: MEK) of 2-ethyl-4(5)-methylimidazole ("EMI24", tradename, manufactured by Mitsubishi Chemical Corporation) as a curing agent were weighed, and stirred and mixed by a rotary and evolutionary mixer and defoamed. With respect to the resulting epoxy resin composition, the coefficient of thermal conductivity of a cured film was obtained. The result is shown in Table 4.

Reference Example 5

In the same manner as in Reference Example 4 except that the polyfunctional epoxy resin was changed to a 80 wt % MEK solution of a biphenyl type polyfunctional epoxy resin ("NC-3000-H", tradename, manufactured by Nippon Kayaku Co., Ltd.), an epoxy resin composition comprising epoxy resin in Preparation Example 1: NC-3000-H: EMI24=60:40:0.5 (parts by weight) was produced, and with respect to the obtained epoxy resin composition, the coefficient of thermal conductivity of a cured film was obtained. The result is shown in Table 4.

Reference Example 6

An epoxy resin composition was produced in the same manner as in Reference Example 5 except that epoxy resin in Preparation Example 1: NC-3000-H:EMI24=30:70:0.5 (parts by weight), and with respect to the obtained epoxy resin composition, the coefficient of thermal conductivity of a cured film was obtained. The result is shown in Table 4.

Reference Example 7

In the same manner as in Reference Example 4 except that the polyfunctional epoxy resin was changed to a 70 wt % cyclohexanone solution of a biphenyl type polyfunctional epoxy resin ("NC-3000", tradename, manufactured by Nippon Kayaku Co., Ltd.), an epoxy resin composition comprising epoxy resin in Preparation Example 1: NC-3000: EMI24=60:40:0.5 (parts by weight) was produced, and with respect to the obtained epoxy resin composition, the coefficient of thermal conductivity of a cured film was obtained. The result is shown in Table 4.

Reference Example 8

An epoxy resin composition was produced in the same manner as in Reference Example 4 except that the composition comprised epoxy resin obtained in Preparation Example 1: 157S65(B80):EM124=90:10:0.5 (parts by weight), and with respect to the obtained epoxy resin composition, the coefficient of thermal conductivity of a cured film was obtained. The result is shown in Table 4.

Examples 4 and 5 Comparative Examples 4 and 5

Epoxy resin (B1) as one type of epoxy resin (B) used in Examples and Comparative Examples was produced by the following method. The materials, catalyst and solvents used are shown below.

Compound (X): "YL6121H", tradename, manufactured by Mitsubishi Chemical Corporation (1:1 mixture of 4,4'-biphenol type epoxy resin and 3,3',5,5'-tetramethyl-4,4'-biphenol type epoxy resin, epoxy equivalent: 171 g/equivalent)

Compound (Y): 3,3'-dimethyl-4,4'-biphenol (OH equivalent: 107 g/equivalent, manufactured by Honshu Chemical Industry Co., Ltd.)

Catalyst: 27 wt % tetramethylammonium hydroxide aqueous solution

Solvent
  Solvent 1: cyclohexanone
  Solvent 2: methyl ethyl ketone

210 Parts by weight of compound (X), 127.6 parts by weight of compound (Y), 0.78 part by weight of catalyst and 181.8 parts by weight of solvent 1 (cyclohexanone) were put in a pressure resistant reactor equipped with a stirrer, and reaction was carried out in a nitrogen gas atmosphere at 180° C. for 5 hours.

Then, 212.1 parts by weight of solvent 1 (cyclohexanone) and 393.8 parts by weight of solvent 2 (methyl ethyl ketone) were added to the pressure resistant reactor to adjust the solid content concentration to 30 wt %.

The solvents were removed from the reaction product by an usual method, and the obtained epoxy resin (B1) was analyzed, and the obtained results are shown below.

Epoxy Resin (B1)
  Weight average molecular weight (Mw): 59,000
  Number average molecular weight (Mn): 14,000
  n in the formula (1): 49
  Epoxy equivalent: 8,150 (g/equivalent)
  Tg: 110 (° C.)
  Extension: 72(%)
  Coefficient of thermal conductivity: 0.21 (W/mK)

TABLE 4

Blend ratio of epoxy resin composition and coefficient of thermal conductivity

| | | | Ref. Ex. 4 | Ref. Ex. 5 | Ref. Ex. 6 | Ref. Ex. 7 | Ref. Ex. 8 |
|---|---|---|---|---|---|---|---|
| Epoxy resin composition blend ratio (parts by weight) | Epoxy resin (B) | Epoxy resin in Prep. Ex. 1 | 60 | 60 | 30 | 60 | 90 |
| | Other epoxy resins | 157S65(B80) | 40 | | | | 10 |
| | | NC-3000-H | | 40 | 70 | | |
| | | NC-3000 | | | | 40 | |
| | Curing agent | EMI24 | 0.5 | 0.5 | 0.5 | 0.5 | 0.5 |
| Coefficient of thermal conductivity | | | 0.22 | 0.20 | 0.21 | 0.22 | 0.21 |

Blanks mean that the material was not used.
In the epoxy resin composition blend ratio, the values for the epoxy resin and other epoxy resins mean the parts by weight of the resin content blended.

From the above results, it is found that the epoxy resin (B) and the composition containing the epoxy resin (B) have sufficient extensibility applicable to processes of film formation, coating and the like, and are also excellent in the balance between the thermal conductivity and the heat resistance.

Epoxy resin (B2), epoxy resin (C), curing agent (C), inorganic filler (D) and solvent (E) used for production of epoxy resin compositions in the following Examples and Comparative Examples are shown below.

Epoxy Resin (B2)
  Special skeleton epoxy resin (YX6954BH30, tradename, manufactured by Mitsubishi Chemical Corporation)

Weight average molecular weight (Mw): 39,000
Solvent: MEK:CHN=1:1
Resin concentration: 30 wt % solution
Epoxy Resin (C)
Epoxy resin (C1): "NC-3000-H", tradename, manufactured by Nippon Kayaku Co., Ltd. (prepared into a 80 wt % MEK solution)
Epoxy resin (C2): "157S65(B80)", tradename, manufactured by Mitsubishi Chemical Corporation (MEK solution: 80 wt %)
Curing agent (C): "EMI24", tradename, manufactured by Mitsubishi Chemical Corporation 2-ethyl-4(5)-methylimidazole Inorganic Filler (D)
Inorganic filler (D1): $Al_2O_3$, "AA-3", tradename, manufactured by Sumitomo Chemical Company, Limited (volume average particle size: 3 μm)
Inorganic filler (D2): $Al_2O_3$, "AA-04", tradename, manufactured by Sumitomo Chemical Company, Limited (volume average particle size: 0.4 μm)
Inorganic filler (D3): BN, "PTX-25", tradename, manufactured by Momentive Performance Materials Japan LLC (volume average particle size of aggregated particles: 25 μm, volume average particle size of primary particles: 3 μm)
Solvent (E): Mixed solvent of MEK and CHN in a weight ratio of 1:1

Example 4

Epoxy resin (B1) and epoxy resin (C1) were blended in a blend weight ratio as identified in Table 5, and to 100 parts by weight of the total amount of epoxy resin (B1) and epoxy resin (C1), 0.5 part by weight of curing agent (C) and a mixture of inorganic filler (D1) and inorganic filler (D2) in a weight ratio of 8:2 as the inorganic filler (D) in such an amount that the content of the inorganic filler in a cured product became 60 vol % (510 parts by weight per 100 parts by weight of the total amount of epoxy resin (B1) and epoxy resin (C1)) were blended, and further, solvent (E) was added so that the solid content concentration in the composition became 60 wt %, to obtain a paste-form coating fluid.

This paste-form coating fluid was applied to a separator (a silicone-treated polyethylene terephthalate film, thickness: 100 μm) by a doctor blade, and heated at 60° C. for 15 minutes, then at 80° C. for 15 minutes and then at 80° C. for 15 minutes under reduced pressure (pressure<4 Torr) to remove the solvent, to obtain a B-stage film. Then, another separator was placed on the obtained B-stage film, and formed and cured by pressing under reduced pressure (pressure of 1 MPa) at 100° C. for 15 minutes, then at 150° C. for 15 minutes and then at 200° C. for 30 minutes, to obtain a cured film having a film thickness of about 50 μm. Of the obtained cured film, the coefficient of thermal conductivity was evaluated. The result is shown in Table 5.

Example 5

In the same manner as in Example 4 except that inorganic filler (D3) was used as inorganic filler (D), that epoxy resin (C2) was used instead of epoxy resin (C1), and that the amount of inorganic filler (D) was 40 vol % in a cured product (129 parts by weight per 100 parts by weight of the total amount of epoxy resin (B1) and epoxy resin (C2)), a cured film was obtained, and its coefficient of thermal conductivity was evaluated. The result is shown in Table 5.

Comparative Example 4

In the same manner as in Example 4 except that epoxy resin (B2) was used instead of epoxy resin (B1) as the epoxy resin, an epoxy resin composition was prepared, and the composition was cured to obtain a cured product, and its coefficient of thermal conductivity was evaluated. The result is shown in Table 5.

Comparative Example 5

In the same manner as in Example 5 except that epoxy resin (B2) was used instead of epoxy resin (B1) as the epoxy resin, an epoxy resin composition was prepared, and the composition was cured to obtain a cured product, and its coefficient of thermal conductivity was evaluated. The results are shown in Table 5.

Values for blended products in Table 1 represent parts by weight (weight of the resin in the solution).

TABLE 5

|  |  | Ex. | | Comp. Ex. | |
|---|---|---|---|---|---|
|  |  | 4 | 5 | 4 | 5 |
| Epoxy resin (B) | B1 | 60 | 60 | — | — |
|  | B2 | — | — | 60 | 60 |
| Epoxy resin (C) | C1 | 40 | — | 40 | — |
|  | C2 | — | 40 | — | 40 |
| Inorganic filler (D) | D1 ($Al_2O_3$) | 407 | — | 407 | — |
|  | D2 ($Al_2O_3$) | 103 | — | 103 | — |
|  | D3 (BN) | — | 129 | — | 129 |
| Curing agent (C) |  | 0.5 | 0.5 | 0.5 | 0.5 |
| Coefficient of thermal conductivity (W/mK) |  | 2.4 | 4.3 | 2.2 | 3.9 |

Examples 6 to 12

[Blended Components]
Blended components for the coating fluid for forming a filling interlayer used in Examples 6 to 12 are as follows.
<Epoxy Resin>
Epoxy resin (A1): the same epoxy resin (A1) used in Example 1
Epoxy resin (A3): "YL6800", product name, manufactured by Mitsubishi Chemical Corporation
Epoxy resin (A4): "1032H60", product name, manufactured by Mitsubishi Chemical Corporation
Epoxy resin (A5): "1001", product name, manufactured by Mitsubishi Chemical Corporation
Epoxy resin (A6): "4004", product name, manufactured by Mitsubishi Chemical Corporation
Epoxy resin (A7): "YX4000", product name, manufactured by Mitsubishi Chemical Corporation
<Flux (B)>
Abietic acid, special grade chemicals, manufactured by Wako Pure Chemical Industries, Ltd.
<Curing Agent (C)>
2-phenyl-4,5-dihydroxymethylimidazole, "2PHZ-PW", product name, manufactured by SHIKOKU CHEMICALS CORPORATION
<Inorganic Filler (D)>
The same boron nitride BN manufactured by NISSIN REFRATECH CO., LTD. as in Example 1

<Organic Solvent (E)>

As organic solvent (E), the above organic solvent (E1) (methyl ethyl ketone, special grade chemicals, manufactured by Wako Pure Chemical Industries, Ltd.) and organic solvent (E2) (cyclohexanone, special grade chemicals, manufactured by Wako Pure Chemical Industries, Ltd.) were used.

[Measurement of Particle Size of Inorganic Filler]

The coating fluid for forming a filling interlayer after stirring and mixing was dispersed in cyclohexanone, followed by measurement by a particle size distribution measuring apparatus "SALD-2200", manufactured by Shimadzu Corporation. From the obtained particle size distribution, the volume average particle size and the maximum volume particle size of the inorganic filler after grinding were obtained.

[Evaluation of Bonding]

(1) Application to Chip

About 10 μL of the coating fluid for forming a filling interlayer after stirring and mixing was spread on a Si chip "CC80-0101JY Model I" manufactured by Waits using a micropipet.

(2) B-Stage Formation

The Si chip coated with the filling interlayer was heated initially at 80° C. for 15 minutes and then at 120° C. for 30 minutes by using a hot plate to carry out B-stage formation.

(3) Evaluation of Bonding

The Si chip coated with the B-Stage filling interlayer, and an organic substrate "CC80-0102JY Model I" manufactured by Waits, were bonded by heat pressing by heating up to 250° C. using a Flip Chip Bonder apparatus "FC3000S" manufactured by Toray Engineering Co., Ltd.

(4) Evaluation of Bonding Properties (Conductive Connection)

A prober terminal was grounded to an electrode on the organic substrate to which the Si chip was bonded, and with respect to a daisy chain formed between the Si chip and the electric terminal of the organic substrate, the conductive connection was evaluated by a multimeter "2100 model" manufactured by Keithley Instruments, and a case where conductive connection was confirmed was rated as ○.

[Preparation of Coating Fluid for Forming Filling Interlayer]

Preparation of Coating Fluid in Example 6

1.67 g of a solution of the above epoxy resin (A1) in a solvent mixture of MEK and CHN in a weight ratio of 1:1, 1.75 g of epoxy resin (A3) and 0.31 g of a 80 wt % cyclohexanone solution of epoxy resin (A4) were mixed so that the blend weight ratio of epoxy resin (A1), epoxy resin (A3) and epoxy resin (A4) as the resin component excluding the solvents became 20:70:10, to obtain epoxy resin composition (I). The melt viscosity and the coefficient of thermal conductivity of epoxy resin composition (I) are shown in Table 6.

3.73 g of epoxy resin composition (I), 2.5 g of inorganic filler (D) and 3.57 g of organic solvent (E2) were put into a polyethylene container, and 20 g of zirconia balls having a diameter of 0.5 mm were further added, followed by stirring by using a rotary and revolutionary stirring machine at 2000 rpm for 20 minutes. After completion of stirring, the zirconia balls were removed by filtration, 0.05 g of flux (B) and 0.15 g of curing agent (C) were added, followed by stirring by a rotary and revolutionary stirring machine further for 6 minutes to obtain a coating fluid of an interlayer filler composition for a three-dimensional integrated circuit. The solid content concentration of the coating fluid was 50 wt %, and the content of inorganic filler (D) was 50 wt % based on the total amount of epoxy resin composition (I) and inorganic filler (D). The volume average particle size and the maximum volume particle size of inorganic filler (D) in the coating fluid of an interlayer filler composition for a three-dimensional integrated circuit are shown in Table 7.

Preparation of Coating Fluid in Example 7

1.67 g of a solution of epoxy resin (A1) in a solvent mixture of MEK and CHN in a weight ratio of 1:1, 1.25 g of epoxy resin (A3), 0.31 g of a 80 wt % cyclohexanone solution of epoxy resin (A4) and 0.71 g of a 70 wt % cyclohexanone solution of epoxy resin (A5) were mixed so that the blend weight ratio of epoxy resin (A1), epoxy resin (A3), epoxy resin (A4) and epoxy resin (A5) as the resin component excluding the solvents became 20:50:10:20, to obtain epoxy resin composition (II). The melt viscosity and the coefficient of thermal conductivity of epoxy resin composition (II) are shown in Table 6.

In the same manner as preparation of the coating fluid in Example 6 except that 3.94 g of epoxy resin composition (II) was used instead of epoxy resin composition (I) and that 3.36 g of organic solvent (E1) was used instead of organic solvent (E2), a coating fluid of an interlayer filler composition for a three-dimensional integrated circuit in Example 7 was prepared. The volume average particle size and the maximum volume particle size of inorganic filler (D) in the coating fluid of an interlayer filler composition for a three-dimensional integrated circuit are shown in Table 7.

Preparation of Coating Fluid in Example 8

The amount of the 80 wt % cyclohexanone solution of epoxy resin (A4) was changed to 0.63 g, and the amount of the 70 wt % cyclohexanone solution of epoxy resin (A5) was changed to 0.36 g, to obtain epoxy resin composition (III) comprising epoxy resin (A1), epoxy resin (A3), epoxy resin (A4) and epoxy resin (A5) in a blend weight ratio of 20:50:20:10 as the resin excluding the solvents. The melt viscosity and the coefficient of thermal conductivity of epoxy resin composition (III) are shown in Table 6.

In the same manner as preparation of the coating fluid in Example 7 except that epoxy resin composition (III) was used, a coating fluid of an interlayer filler composition for a three-dimensional integrated circuit in Example 8 was prepared. The volume average particle size and the maximum volume particle size of inorganic filler (D) in the coating fluid of an interlayer filler composition for a three-dimensional integrated circuit are shown in Table 7.

Preparation of Coating Fluid in Example 9

1.75 g of epoxy resin (A6), 0.7 g of epoxy resin (A3), 0.35 g of a 80 wt % cyclohexanone solution of epoxy resin (A4) and 0.70 g of a 70 wt % cyclohexanone solution of epoxy resin (A5) were mixed, and the blend weight ratio of epoxy resin (A6), epoxy resin (A3), epoxy resin (A4) and epoxy resin (A5) as the resin component excluding the solvents was adjusted to be 50:20:10:20 to obtain epoxy resin composition (IV). The melt viscosity and the coefficient of thermal conductivity of epoxy resin composition (IV) are shown in Table 6.

In the same manner as preparation of the coating fluid in Example 6 except that 3.50 g of epoxy resin composition (IV) was used instead of epoxy resin composition (I), that the amount of flux (B) was 0.07 g, the amount of curing agent (C) was 0.21 g and the amount of inorganic filler (D) was 1.5 g, and that 4.25 g of organic solvent (E1) and 0.47 g of organic solvent (E2) were used instead of organic solvent (E2), a coating fluid of an interlayer filler composition for a three-dimensional integrated circuit in Example 9 was prepared. The solid content concentration of the coating fluid was 50 wt %, and the content of the inorganic filler (D) was 30 wt % based on epoxy resin composition (I). The volume average particle size and the maximum volume particle size of inorganic filler (D) in the coating fluid of an interlayer filler composition for a three-dimensional integrated circuit are shown in Table 7.

Preparation of Coating Fluid in Examples 10 to 13

Resin compositions (V) to (VIII) were prepared in the same manner as in preparation of the coating fluid of an interlayer filler composition for a three-dimensional integrated circuit in Example 9 except that epoxy resin (A3), epoxy resin (A4), epoxy resin (A5), epoxy resin (A6) and epoxy resin (A7) were mixed in a proportion as identified in Table 8. The melt viscosity and the coefficient of thermal conductivity of each of epoxy resin compositions (V) to (VIII) are shown in Table 6.

Coating fluids of an interlayer filler composition for a three-dimensional integrated circuit in Examples 10 to 13 were prepared in the same manner as in preparation of the coating fluid of an interlayer filler composition for a three-dimensional integrated circuit in Example 9 except that resin compositions (V) to (VIII) were used. The volume average particle size and the maximum volume particle size of inorganic filler (D) in each of the coating fluids of an interlayer filler composition for a three-dimensional integrated circuit are shown in Table 7.

Examples 6 to 13

About 10 μL of each of the coating fluids of an interlayer filler composition for a three-dimensional integrated circuit was spread on a Si chip "CC80-0101JY Model I", and heated at 80° C. for 15 minutes and then at 120° C. for 30 minutes to carry out B-stage formation. The Si chip and an organic substrate "CC80-0102JY Model I" were bonded by heat pressing by heating up to 250° C. by a flip chip bonder apparatus. After bonding, a prober terminal was grounded to an electrode on the organic substrate, and with respect to a daisy chain formed between the Si chip and the electric terminal of the organic substrate, the conductive connection was evaluated. The results of evaluation of conductive connection are shown in Table 7. A case where conductive connection was confirmed was rated as ◯, and a case where conductive connection was not confirmed was rated as X.

TABLE 6

Composition of resin and physical properties of resin composition

| Composition of resin | Epoxy resin | | | | | | Coefficient of thermal conductivity (W/mK) | Melt viscosity (Pa · s) |
|---|---|---|---|---|---|---|---|---|
| | A1 | A3 | A4 | A5 | A6 | A7 | | |
| I | 20 | 70 | 10 | | | | 0.22 | 2.4 |
| II | 20 | 50 | 10 | 20 | | | 0.20 | 2.1 |

TABLE 6-continued

Composition of resin and physical properties of resin composition

| Composition of resin | Epoxy resin | | | | | | Coefficient of thermal conductivity (W/mK) | Melt viscosity (Pa · s) |
|---|---|---|---|---|---|---|---|---|
| | A1 | A3 | A4 | A5 | A6 | A7 | | |
| III | 20 | 50 | 20 | 10 | | | 0.23 | 1.3 |
| IV | | 20 | 10 | 20 | 50 | | 0.21 | 1.3 |
| V | | | 10 | 60 | 30 | | 0.21 | 3 |
| VI | | | 10 | 80 | 10 | | 0.20 | 1.9 |
| VII | | | 10 | 20 | 40 | 30 | 0.22 | 1.3 |
| VIII | | 30 | 10 | | 60 | | 0.20 | 2.3 |

The amount of epoxy resin represents weight ratio, and blanks mean that the material was not used.

TABLE 7

Particle size of filler (D) in resin composition and results of evaluation of bonding

| | Composition of resin | Filler | | | Bonding properties |
|---|---|---|---|---|---|
| | | wt % | Average (μm) | Maximum (μm) | |
| Ex. 6 | I | 50 | 5 | 10 | ◯ |
| Ex. 7 | II | 50 | 4 | 9 | ◯ |
| Ex. 8 | III | 50 | 4 | 8 | ◯ |
| Ex. 9 | IV | 30 | 4 | 9 | ◯ |
| Ex. 10 | V | 30 | 3 | 9 | ◯ |
| Ex. 11 | VI | 30 | 4 | 9 | ◯ |
| Ex. 12 | VII | 30 | 3 | 9 | ◯ |
| Ex. 13 | VIII | 30 | 4 | 9 | ◯ |

INDUSTRIAL APPLICABILITY

According to the present invention, it is possible to provide an interlayer filler composition which forms a highly thermally conductive filling interlayer simultaneously with bonding of solder bumps or the like and lands between semiconductor device substrates, a coating fluid and a process for producing a three-dimensional integrated circuit.

This application is a continuation of PCT Application No. PCT/JP2011/073969, filed on Oct. 18, 2011, which is based upon and claims the benefit of priority from Japanese Patent Application No. 2010-233799 filed on Oct. 18, 2010, Japanese Patent Application No. 2010-268412 filed on Dec. 1, 2010, Japanese Patent Application No. 2010-268413 filed on Dec. 1, 2010 and Japanese Patent Application No. 2010-274544 filed on Dec. 9, 2010. The contents of those applications are incorporated herein by reference in its entirety.

What is claimed is:

1. An interlayer filler composition, consisting essentially of:
   an epoxy resin (A) having a melt viscosity at 120° C. of at most 100 Pa·s;
   a flux (B);
   a curing agent (C);
   an inorganic filler (D) having a maximum volume particle size of at most 10 μm and a volume average particle size of least 0.1 μm and at most 5 μm; and
   at least one additive selected from the group consisting of a coupling agent, an ultraviolet inhibitor, an antioxidant, a plasticizer, a flame retardant, a coloring agent, a dispersing agent, a fluidity-improving agent, and an adhesion-improving agent;

wherein:

a content of the flux (B) is at least 0.1 part by weight and at most 10 parts by weight per 100 parts by weight of the resin (A); and the curing agent (C) is at least one member selected from the group consisting of a phenol type curing agent, an acid anhydride type curing agent, an amide type curing agent, a tertiary amine, imidazole or a derivative thereof, an organic phosphine, a phosphonium salt, a tetraphenylborate salt, an organic acid dihydrazide, a boron halide amine complex, a polymercaptan type curing agent, an isocyanate type curing agent, and a blocked isocyanate type curing agent.

2. The interlayer filler composition according to claim 1, which contains the inorganic filler (D) in an amount of at least 50 parts by weight and at most 400 parts by weight per 100 parts by weight of the resin (A).

3. The interlayer filler composition according to claim 2, wherein the amount of the inorganic filler (D) is at least 5 vol % and at most 60 vol % based on the total volume of the resin (A) and the inorganic filler (D).

4. The interlayer filler composition according to claim 2, wherein the inorganic filler (D) is boron nitride.

5. The interlayer filler composition according to claim 1, wherein the melt viscosity of the resin (A) at 50° C. is at least 2,000 Pa·s.

6. The interlayer filler composition according to claim 1, wherein the resin (A) is a thermosetting resin.

7. The interlayer filler composition according to claim 1, wherein the epoxy resin is an epoxy resin (A1) which is a phenoxy resin, or a mixture of the epoxy resin (A1) and an epoxy resin (A2) which is an epoxy resin having at least two epoxy groups in its molecule.

8. The interlayer filler composition according to claim 1, wherein the flux (B) is an organic carboxylic acid.

9. The interlayer filler composition according to claim 8, wherein the decomposition temperature of the organic carboxylic acid is at least 130° C.

10. The interlayer filler composition according to claim 1, wherein the curing agent (C) is imidazole or a derivative thereof.

11. A coating fluid of an interlayer filler composition, which comprises the interlayer filler composition as defined in claim 1 and further comprises an organic solvent (E).

12. The interlayer filler composition according to claim 1, wherein the content of the flux (B) is at least 0.1 part by weight and at most 5 parts by weight per 100 parts by weight of the resin (A).

13. The interlayer filler composition according to claim 1, wherein the inorganic filler (D) is alumina.

14. The interlayer filler composition according to claim 1, wherein the interlayer filler composition comprises 0.1 to 60 parts by weight of the curing agent (C) per 100 parts by weight of the epoxy resin (A).

15. The interlayer filler composition according to claim 1, wherein the inorganic filler (D) has a coefficient of thermal conductivity of at least 2 W/mK.

16. The interlayer filler composition according to claim 1, wherein the wherein the inorganic filler (D) is alumina or boron nitride.

17. An interlayer filler composition, consisting of:

an epoxy resin (A) having a melt viscosity at 120° C. of at most 100 Pa·s;

a flux (B);

a curing agent (C);

an inorganic filler (D) having a maximum volume particle size of at most 10 μm and a volume average particle size of least 0.1 μm and at most 5 μm; and at least one additive selected from the group consisting of a coupling agent, an ultraviolet inhibitor, an antioxidant, a plasticizer, a flame retardant, a coloring agent, a dispersing agent, a fluidity-improving agent, and an adhesion-improving agent;

wherein:

a content of the flux (B) is at least 0.1 part by weight and at most 10 parts by weight per 100 parts by weight of the resin (A); and the curing agent (C) is at least one member selected from the group consisting of a phenol type curing agent, an acid anhydride type curing agent, an amide type curing agent, a tertiary amine, imidazole or a derivative thereof, an organic phosphine, a phosphonium salt, a tetraphenylborate salt, an organic acid dihydrazide, a boron halide amine complex, a polymercaptan type curing agent, an isocyanate type curing agent, and a blocked isocyanate type curing agent.

18. An interlayer filler composition, consisting essentially of:

an epoxy resin (A) having a melt viscosity at 120° C. of at most 100 Pa·s;

a flux (B);

a curing agent (C); and an inorganic filler (D) having a maximum volume particle size of at most 10 μm and a volume average particle size of least 0.1 μm and at most 5 μm wherein:

a content of the flux (B) is at least 0.1 part by weight and at most 10 parts by weight per 100 parts by weight of the resin (A); and the curing agent (C) is at least one member selected from the group consisting of a phenol type curing agent, an acid anhydride type curing agent, an amide type curing agent, a tertiary amine, imidazole or a derivative thereof, an organic phosphine, a phosphonium salt, a tetraphenylborate salt, an organic acid dihydrazide, a boron halide amine complex, a polymercaptan type curing agent, an isocyanate type curing agent, and a blocked isocyanate type curing agent.

19. The interlayer filler composition according to claim 18, which contains the inorganic filler (D) in an amount of at least 50 parts by weight and at most 400 parts by weight per 100 parts by weight of the resin (A).

20. The interlayer filler composition according to claim 19, wherein the amount of the inorganic filler (D) is at least 5 vol % and at most 60 vol % based on the total volume of the resin (A) and the inorganic filler (D).

21. The interlayer filler composition according to claim 19, wherein the inorganic filler (D) is boron nitride.

22. The interlayer filler composition according to claim 18, wherein the melt viscosity of the resin (A) at 50° C. is at least 2,000 Pa·s.

23. The interlayer filler composition according to claim 18, wherein the resin (A) is a thermosetting resin.

24. The interlayer filler composition according to claim 18, wherein the epoxy resin is an epoxy resin (A1) which is a phenoxy resin, or a mixture of the epoxy resin (A1) and an epoxy resin (A2) which is an epoxy resin having at least two epoxy groups in its molecule.

25. The interlayer filler composition according to claim 18, wherein the flux (B) is an organic carboxylic acid.

26. The interlayer filler composition according to claim 25, wherein the decomposition temperature of the organic carboxylic acid is at least 130° C.

27. The interlayer filler composition according to claim 18, wherein the curing agent (C) is imidazole or a derivative thereof.

28. The interlayer filler composition according to claim 18, wherein the content of the flux (B) is at least 0.1 part by weight and at most 5 parts by weight per 100 parts by weight of the resin (A).

29. The interlayer filler composition according to claim 18, wherein the inorganic filler (D) is alumina.

30. The interlayer filler composition according to claim 18, wherein the interlayer filler composition comprises 0.1 to 60 parts by weight of the curing agent (C) per 100 parts by weight of the epoxy resin (A).

31. The interlayer filler composition according to claim 18, wherein the inorganic filler (D) has a coefficient of thermal conductivity of at least 2 W/mK.

32. The interlayer filler composition according to claim 18, wherein the wherein the inorganic filler (D) is alumina or boron nitride.

33. A coating fluid of an interlayer filler composition, which comprises the interlayer filler composition as defined in claim 18 and further comprises an organic solvent (E).

34. An interlayer filler composition, consisting of:

an epoxy resin (A) having a melt viscosity at 120° C. of at most 100 Pa·s;

a flux (B);

a curing agent (C); and an inorganic filler (D) having a maximum volume particle size of at most 10 μm and a volume average particle size of least 0.1 μm and at most 5 μm;

wherein;

a content of the flux (B) is at least 0.1 part by weight and at most 10 parts by weight per 100 parts by weight of the resin (A); and the curing agent (C) is at least one member selected from the group consisting of a phenol type curing agent, an acid anhydride type curing agent, an amide type curing agent, a tertiary amine, imidazole or a derivative thereof, an organic phosphine, a phosphonium salt, a tetraphenylborate salt, an organic acid dihydrazide, a boron halide amine complex, a polymercaptan type curing agent, an isocyanate type curing agent, and a blocked isocyanate type curing agent.

* * * * *

UNITED STATES PATENT AND TRADEMARK OFFICE
CERTIFICATE OF CORRECTION

PATENT NO. : 9,960,092 B2
APPLICATION NO. : 13/865318
DATED : May 1, 2018
INVENTOR(S) : Makoto Ikemoto et al.

Page 1 of 1

It is certified that error appears in the above-identified patent and that said Letters Patent is hereby corrected as shown below:

On the Title Page

Item (30) "Sep. 12, 2010" should read --Dec. 9, 2010--.

Signed and Sealed this
Twenty-first Day of August, 2018

Andrei Iancu
*Director of the United States Patent and Trademark Office*